US012696498B2

(12) United States Patent
Narita et al.

(10) Patent No.: US 12,696,498 B2
(45) Date of Patent: Jul. 28, 2026

(54) SILICON CARBIDE SEMICONDUCTOR DEVICE WITH PARALLEL PN LAYER HAVING COLUMNS OF SAME CONDUCTIVITY TYPE AND DIFFERENT LENGTHS

(71) Applicant: FUJI ELECTRIC CO., LTD.,
Kawasaki (JP)

(72) Inventors: Syunki Narita, Matsumoto-city (JP);
Shinsuke Harada, Tsukuba-city (JP)

(73) Assignee: FUJI ELECTRIC CO., LTD.,
Kawasaki (JP)

( * ) Notice: Subject to any disclaimer, the term of this patent is extended or adjusted under 35 U.S.C. 154(b) by 600 days.

(21) Appl. No.: 18/170,767

(22) Filed: Feb. 17, 2023

(65) Prior Publication Data

US 2023/0275122 A1 Aug. 31, 2023

(30) Foreign Application Priority Data

Feb. 25, 2022 (JP) ................................. 2022-028626

(51) Int. Cl.
*H10D 62/10* (2025.01)
*H10D 30/66* (2025.01)
(Continued)

(52) U.S. Cl.
CPC ......... *H10D 62/111* (2025.01); *H10D 30/665* (2025.01); *H10D 30/668* (2025.01); *H10D 62/393* (2025.01); *H10D 62/8325* (2025.01)

(58) Field of Classification Search
CPC .. H10D 62/111; H10D 30/665; H10D 30/668; H10D 62/393; H10D 62/8325;
(Continued)

(56) References Cited

U.S. PATENT DOCUMENTS 9,190,469 B2 * 11/2015 Jun ...................... H10D 62/157
9,281,392 B2 * 3/2016 Weyers ................ H10D 62/114
(Continued)

FOREIGN PATENT DOCUMENTS

JP 2006351713 A 12/2006
JP 2007-335844 A 12/2007
(Continued)

OTHER PUBLICATIONS

Office Action of corresponding Japanese Patent Application No. 2022-028626 dated Oct. 21, 2025.

*Primary Examiner* — Mohammad M Hoque
(74) *Attorney, Agent, or Firm* — Rabin & Berdo, P.C.

(57) ABSTRACT

A semiconductor device including a semiconductor substrate, a parallel pn layer and a device structure provided in the semiconductor substrate, first and second electrodes respectively provided at two main surfaces of the semiconductor substrate, the first electrode being electrically connected to the device structure. The parallel pn layer includes first-conductivity-type column regions and second-conductivity-type column regions that are adjacently disposed and repeatedly alternate with one another in a first direction parallel to the first main surface, that each extend in a second direction parallel to the first main surface and orthogonal to the first direction, and that are of a same impurity concentration. A portion of the second-conductivity-type column regions is shorter than the rest thereof. The parallel pn layer has a first portion and a second portion respectively closer to the first and second main surfaces, the first portion being more p-rich, and less n-rich, than the second portion.

12 Claims, 19 Drawing Sheets

(51) Int. Cl.
   *H10D 62/17*       (2025.01)
   *H10D 62/832*     (2025.01)

(58) Field of Classification Search
   CPC .. H10D 62/051; H10D 62/127; H10D 62/112;
              H10D 62/105; H10D 62/107; H10D
                                        62/117
   USPC .......................................................... 257/77
   See application file for complete search history.

(56) References Cited

U.S. PATENT DOCUMENTS

| | | | | |
|---|---|---|---|---|
| 9,698,256 | B2 * | 7/2017 | You ....................... | H10D 62/111 |
| 10,580,884 | B2 * | 3/2020 | Harrington, III .... | H10D 12/461 |
| 2006/0043480 | A1 * | 3/2006 | Tsuchitani ........... | H10D 62/111 |
| | | | | 257/341 |
| 2007/0272979 | A1 * | 11/2007 | Saito .................... | H10D 30/665 |
| | | | | 257/E29.328 |
| 2008/0315299 | A1 * | 12/2008 | Saito .................... | H10D 62/111 |
| | | | | 257/329 |
| 2012/0326226 | A1 * | 12/2012 | Xiao .................... | H10D 62/058 |
| | | | | 257/329 |
| 2014/0175593 | A1 * | 6/2014 | Schulze ............... | H10D 12/032 |
| | | | | 257/494 |
| 2014/0231912 | A1 * | 8/2014 | Willmeroth .......... | H10D 12/441 |
| | | | | 257/339 |
| 2015/0076600 | A1 * | 3/2015 | Jun .................... | H01L 21/26513 |
| | | | | 257/339 |
| 2017/0117394 | A1 | 4/2017 | Pfirsch et al. | |
| 2018/0286952 | A1 | 10/2018 | Abiko et al. | |
| 2020/0091335 | A1 | 3/2020 | Ono et al. | |
| 2020/0365719 | A1 * | 11/2020 | Nishimura .......... | H10D 30/668 |
| 2022/0069075 | A1 * | 3/2022 | Lee ...................... | H10D 64/111 |

FOREIGN PATENT DOCUMENTS

| | | |
|---|---|---|
| JP | 2018174172 A | 11/2018 |
| JP | 2020047623 A | 3/2020 |
| JP | 2020-191441 A | 11/2020 |

* cited by examiner

1

SILICON CARBIDE SEMICONDUCTOR DEVICE WITH PARALLEL PN LAYER HAVING COLUMNS OF SAME CONDUCTIVITY TYPE AND DIFFERENT LENGTHS

CROSS REFERENCE TO RELATED APPLICATIONS

This application is based upon and claims the benefit of priority of the prior Japanese Patent Application No. 2022-028626, filed on Feb. 25, 2022, the entire contents of which are incorporated herein by reference.

BACKGROUND OF THE INVENTION

1. Field of the Invention

Embodiments of the invention relate to a silicon carbide semiconductor device.

2. Description of the Related Art

A metal oxide semiconductor field effect transistor (MOS-FET) that has insulated gates with a three-layer structure including a metal, an oxide film and a semiconductor and that further has a superjunction (SJ) structure having, as a drift layer, a parallel pn layer in which n-type regions and p-type regions are disposed adjacently so as to repeatedly alternate with one another in a first direction that is parallel to a main surface of a semiconductor substrate is conventionally known.

The drift layer is constituted by a SJ structure, whereby an impurity concentration of the drift layer may be increased and on-resistance is significantly reduced as compared to a normal drift layer constituted by only an n-type region. Further, since the drift layer is constituted by a SJ structure, increases in on-resistance during high-temperature operation are suppressed. High-temperature operation is operation of the semiconductor device under a state in which the semiconductor substrate (semiconductor chip) becomes a high temperature due to operation under an environment of a high temperature, application of high voltage, conduction of a large current, or the like.

FIG. 15 is a plan view depicting a layout when a conventional silicon carbide semiconductor device is viewed from a front side of a semiconductor substrate thereof. In FIG. 15, the number of n-type column regions 131 and p-type column regions 132 is simplified and differs from that in FIG. 16. FIGS. 16, 17, and 18 are cross-sectional views of the structure along cutting line AA-AA', cutting line BB-BB', and cutting line CC-CC' in FIG. 15, respectively. In FIGS. 15, 16, and 18, the p-type column regions 132 are indicated by hatching.

The conventional silicon carbide semiconductor device 150 depicted in FIGS. 15 to 18 is a trench gate type SiC-MOSFET with a SJ structure having, in a semiconductor substrate 140 containing silicon carbide (SiC) as a semiconductor material, a parallel pn layer 103 that constitutes a drift layer. In the semiconductor substrate 140, epitaxial layers 142, 143 constituting the parallel pn layer 103 and a p-type base region 104 are sequentially formed by epitaxial growth on an $n^+$-type starting substrate 141 that contains SiC as a semiconductor material.

In the parallel pn layer 103, n-type regions (hereinafter, n-type column regions) 131 and p-type regions (hereinafter, p-type column regions) 132 are disposed adjacently so as to repeatedly alternate with one another in a first direction X that is parallel to a main surface of the semiconductor substrate 140. The n-type column regions 131 and the p-type column regions 132, in an entire area of the semiconductor substrate 140, extend in a striped pattern in a second direction Y that is parallel to the main surface of the semiconductor substrate 140 and orthogonal to the first direction X.

In both an active region 110 and an edge termination region 120, the drift layer is configured by a same SJ structure. A width Wn101 of the n-type column regions 131 and a width Wp101 of the p-type column regions 132 are uniform in the second direction Y, spanning the active region 110 and the edge termination region 120, and the n-type column regions 131 and the p-type column regions are uniform in a depth direction Z. The width (width in a lateral direction) Wn101 of the n-type column regions 131 and the width Wp101 of the p-type column regions 132 are substantially equal.

A length Dn101 of the n-type column regions 131 in a depth direction Z and a length Dp101 of the p-type column regions 132 in the depth direction Z are uniform spanning the active region 110 and the edge termination region 120 in the second direction Y. The length Dn101 of the n-type column regions 131 in the depth direction Z and the length Dp101 of the p-type column regions 132 in the depth direction Z are substantially equal. An impurity concentration of the n-type column regions 131 and an impurity concentration of the n-type column regions 132 are substantially equal.

The lengths Dn101, Dp101 of the n-type column regions 131 and the p-type column regions 132 in the depth direction Z are lengths of the n-type column regions 131 and the p-type column regions 132, from interfaces thereof with the $p^+$-type regions 111, 112 to interfaces thereof with the n-type buffer region 102. Substantially equal widths, substantially equal depths, and substantially equal impurity concentrations mean, respectively, equal widths, equal depths, and equal impurity concentrations within a range that includes an allowable error due to process variation.

Charge of the n-type column regions 131 and the p-type column regions 132 adjacent to one another is generally in equilibrium, spanning the entire area of the semiconductor substrate 140. Charge balance is an index indicating a degree of equilibrium between an amount of charge expressed by a product obtained by multiplying carrier concentration and the width Wn101 of the n-type column regions 131 and an amount of change expressed by a product obtained by multiplying carrier concentration and the width Wp101 of the p-type column regions 132.

In the edge termination region 120, a voltage withstanding structure 121 is disposed between a front surface of the semiconductor substrate 140 and the parallel pn layer 103. In a SiC-MOSFET, use of a double-zone junction termination extension (JTE) structure as the voltage withstanding structure 121 is known. FIGS. 16 to 18 depict an instance in which a double-zone JTE structure is disposed as the voltage withstanding structure 121.

A JTE structure is a structure in which p-type regions each having a different impurity concentration are disposed adjacent to one another in descending order of impurity concentration in a direction from the active region 110 to an end of the semiconductor substrate 140 (chip end) in concentric shapes surrounding a periphery of the active region 110. The double-zone JTE structure is a JTE structure configured by two p-type regions (p-type region 122, $p^{--}$-type region 123) of different impurity concentrations.

The p$^+$-type regions 111, 112 are each selectively provided between the parallel pn layer 103 and the p-type base region 104, closer to an n$^+$-type drain region 101 than are bottoms of gate trenches 107. The p$^+$-type regions 111, 112 have a function of mitigating electric field applied to the bottoms of the gate trenches 107. The p$^+$-type regions 111, 112 are adjacent to the n-type column regions 131 and the p-type column regions 132, respectively, in the depth direction Z.

The n-type buffer region 102 is provided between and in contact with the n$^+$-type drain region 101 (the n$^+$-type starting substrate 141) and the parallel pn layer 103. In FIGS. 16 to 18, an interface between the n-type buffer region 102 and the parallel pn layer 103 is indicated by a dashed line. Reference numerals 105, 106, 109, 114, 115, and 116 are n$^+$-type source regions, p$^{++}$-type contact regions, gate electrodes, an interlayer insulating film, a source electrode, and a drain electrode, respectively.

As for a conventional SiC-MOSFET having a SJ structure, a device has been proposed in which n-type column regions and p-type column regions of a parallel pn layer that constitutes a drift layer extend in a striped pattern in the active region and the edge termination region, the p-type column regions include plurality of long p-type column regions provided at a depth reaching an n-type buffer region and short p-type column regions provided at a depth shallower than the n-type buffer region (for example, refer to Japanese Laid-Open Patent Publication No. 2020-191441).

In Japanese Laid-Open Patent Publication No. 2020-191441, the depth of the p-type column regions is reduced at predetermined intervals in a longitudinal direction, whereby the short p-type column regions are partially disposed in the active region. Due to the short p-type column regions, the drift layer of the active region is n-rich (state in which the n-type impurity amount is greater than p-type impurity amount), and the on-resistance is reduced. Further, due to the p-type column regions, locations where avalanche occurs are induced at a depth away from the channel (n-type inversion layer), and avalanche capability is enhanced.

As for another conventional SiC-MOSFET having a SJ structure, a device has been proposed in which n-type column regions and p-type column regions of a parallel pn layer constituting a drift layer extend in a striped pattern from the active region to the end of the semiconductor substrate, and in border region between the active region and the edge termination region, depths of the n-type column regions and the p-type column regions become shallower stepwise in a direction to the end of the substrate (for example, refer to Japanese Laid-Open Patent Publication No. 2007-335844).

In Japanese Laid-Open Patent Publication No. 2007-335844, portions of the n-type column regions and the p-type column regions where equilibrium of the charge therebetween is lost due to contact with an n$^-$-type high-resistance region adjacent to the parallel pn layer (the n$^-$-type high-resistance region being closer to the chip end than is the parallel pn layer) do not occur at the same position in a direction parallel to the front surface of the semiconductor substrate, over an entire area in the depth direction but rather occur at positions with increasing depth from the front surface of the semiconductor substrate so as to be distributed stepwise in the depth direction, whereby decreases in the breakdown voltage are suppressed.

SUMMARY OF THE INVENTION

According to an embodiment of the present invention, a silicon carbide semiconductor device includes: a semiconductor substrate containing silicon carbide, the semiconductor substrate having an active region, and a termination region surrounding a periphery of the active region in a plan view of the silicon carbide semiconductor device, the semiconductor substrate having a first main surface and a second main surface that are opposite to each other; a parallel pn layer provided in the semiconductor substrate; a device structure provided in the semiconductor substrate and between the first main surface and the parallel pn layer; a first electrode provided at the first main surface of the semiconductor substrate and electrically connected to the device structure; and a second electrode provided on the second main surface of the semiconductor substrate. The parallel pn layer includes a plurality of first-conductivity-type column regions and a plurality of second-conductivity-type column regions that are adjacently disposed and repeatedly alternate with one another in a first direction that is parallel to the first main surface of the semiconductor substrate. The plurality of first-conductivity-type column regions and the plurality of second-conductivity-type column regions span the active region and the termination region, and each extend in a second direction that is parallel to the first main surface and orthogonal to the first direction. Each of the plurality of first-conductivity-type column regions is of a same first impurity concentration. Each of the plurality of second-conductivity-type column regions is of a second impurity concentration that is equal to the first impurity concentration. The plurality of second-conductivity-type column regions includes a plurality of first-length column regions and a plurality of second-length column regions, each second-length column region extending linearly in the second direction, and having, in a depth direction of the device, a length that is shorter than a length of each of the plurality of first-length column regions. The parallel pn layer has a first portion and a second portion, the first portion being closer to the first main surface of the semiconductor substrate than is the second portion, and being more p-rich than the second portion, the second portion being closer to the second main surface of the semiconductor substrate than is the first portion and being more n-rich than the first portion.

Objects, features, and advantages of the present invention are specifically set forth in or will become apparent from the following detailed description of the invention when read in conjunction with the accompanying drawings.

DETAILED DESCRIPTION OF THE INVENTION

Figure 1:
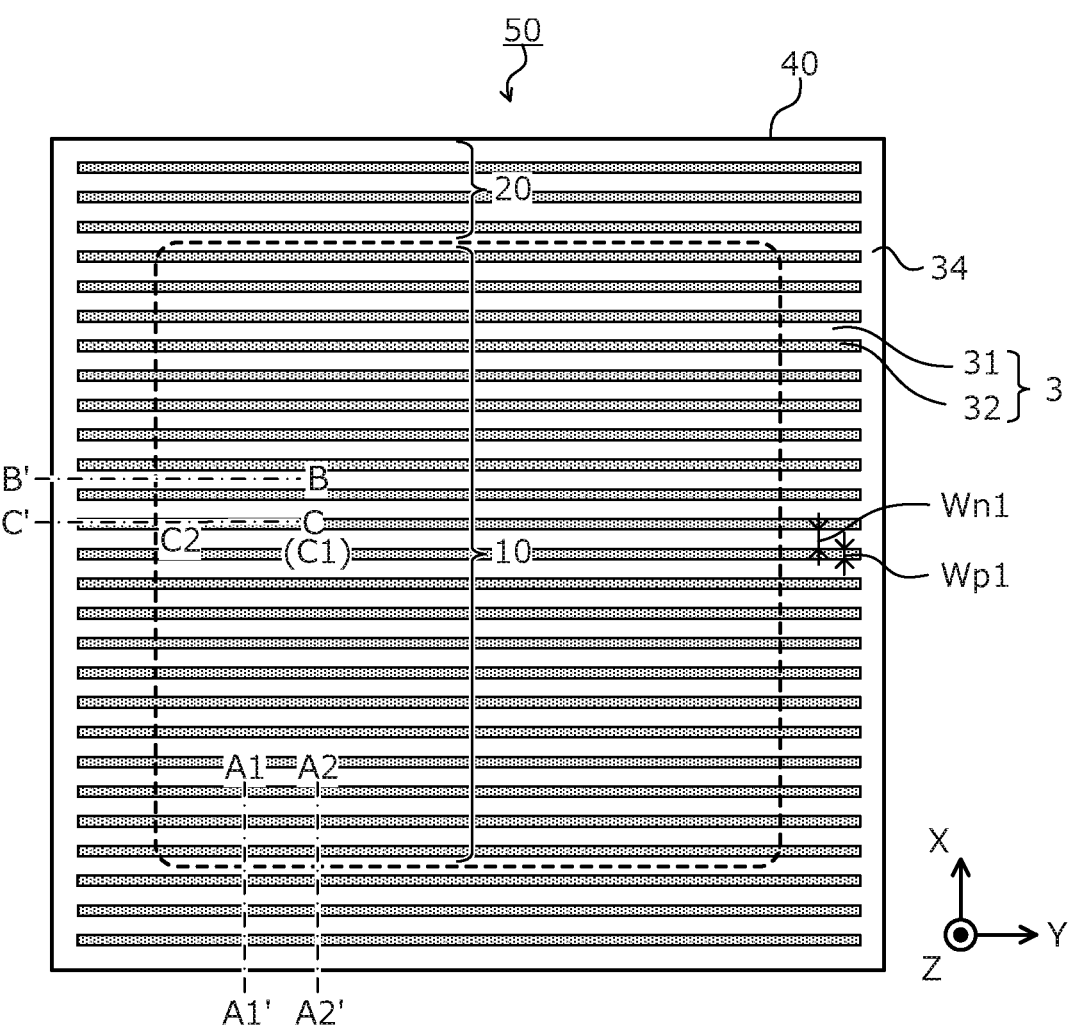
FIG. 1 is a plan view depicting a layout when a silicon carbide semiconductor device according to a first embodiment is viewed from a front side of a semiconductor substrate thereof.

First, problems associated with the conventional techniques are discussed. As described above, in the conventional SiC-MOSFET having a SJ structure (refer to FIGS. 15 to 18), in both the active region 110 and the edge termination region 120, the drift layer is configured by the same SJ structure (the n-type column regions 131 and the p-type column regions 132). Thus, the breakdown voltage of the edge termination region 120 becomes lower than the breakdown voltage of the active region 110 and avalanche breakdown easily occurs in the edge termination region 120. As a result, a problem arises in that resistance to destruction is small as compared to an instance of avalanche breakdown in the active region 110, which has a large area and occupies a majority of the area (surface area) of the semiconductor substrate 140.

Embodiments of a silicon carbide semiconductor device according to the present invention are described in detail with reference to the accompanying drawings. In the present description and accompanying drawings, layers and regions prefixed with n or p mean that majority carriers are electrons or holes. Additionally, + or – appended to n or p means that the impurity concentration is higher or lower, respectively, than layers and regions without + or –. In the description of the embodiments below and the accompanying drawings, main portions that are identical are given the same reference numerals and are not repeatedly described.

Figure 2:
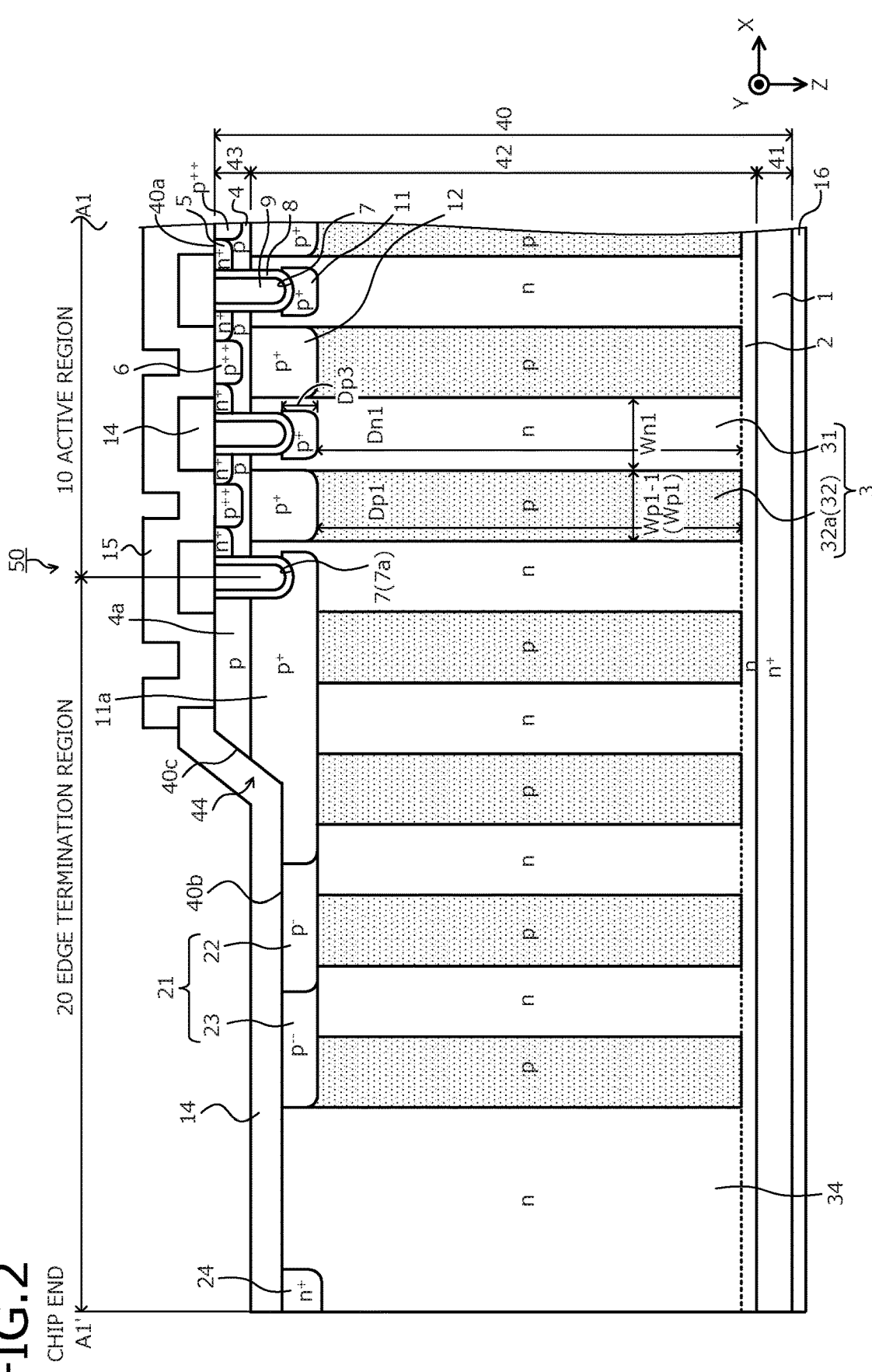
FIG. 2 is a cross-sectional view of the structure along cutting line A1-A1' in FIG. 1.
Figure 3:
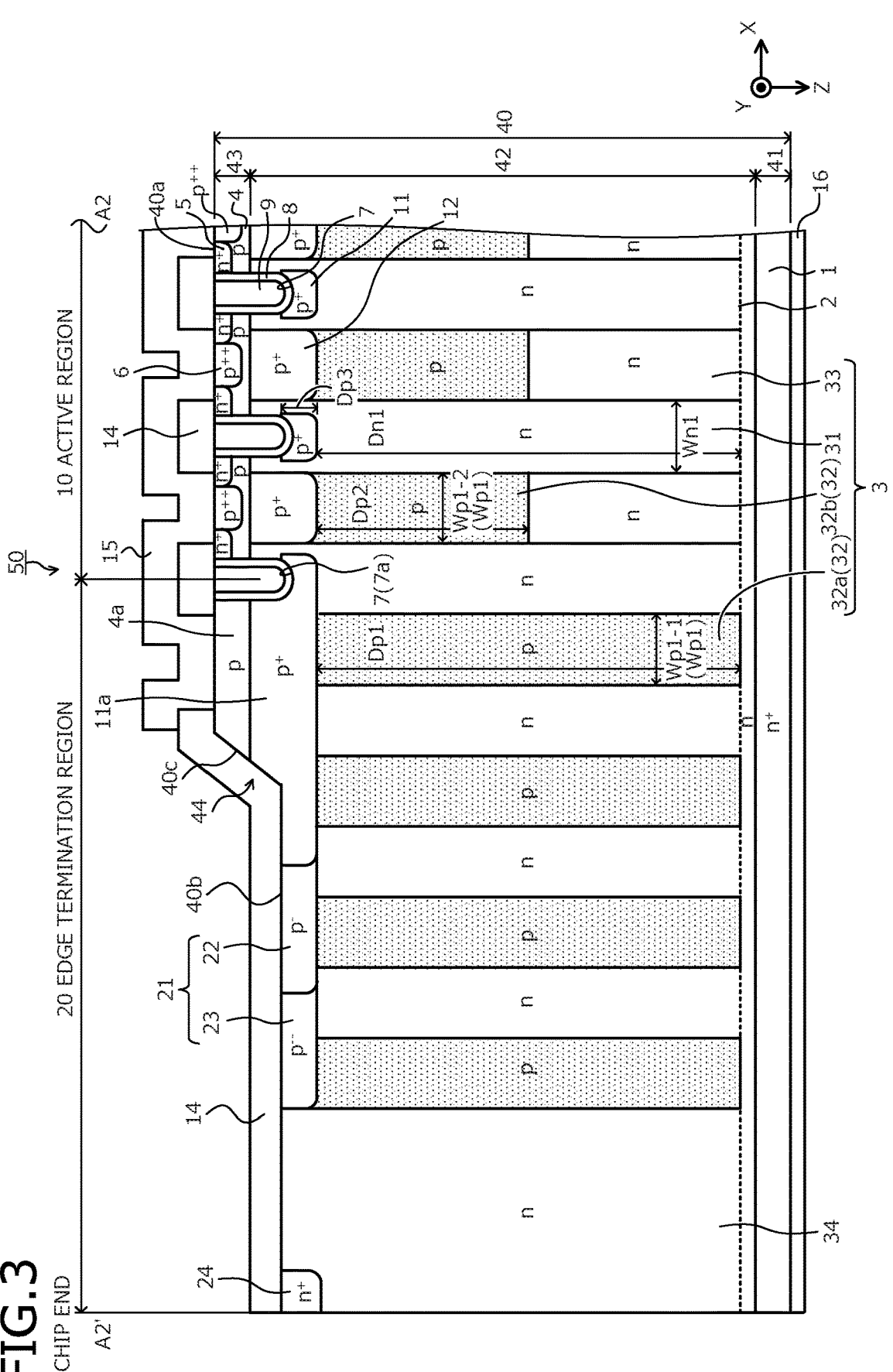
FIG. 3 is a cross-sectional view of the structure along cutting line A2-A2' in FIG. 1.

A structure of a silicon carbide semiconductor device according to a first embodiment is described. FIG. 1 is a plan view depicting a layout when the silicon carbide semiconductor device according to the first embodiment is viewed from a front side of a semiconductor substrate thereof. In FIG. 1, the number of n-type column regions 31 and p-type column regions 32 of a parallel pn layer 3 is simplified and differs from that depicted in FIGS. 2 and 3. FIGS. 2, 3, 4, and 5 are cross-sectional views of the structure along cutting line A1-A1', cutting line A2-A2', cutting line B-B', and cutting line C-C' in FIG. 1, respectively. FIGS. 2 and 3 depict cross-sections of the p-type column regions 32 (32a, 32b) as viewed from the second direction Y (longitudinal direction); the p-type column regions 32 (32a, 32b) have different lengths Dp1, Dp2 in the depth direction Z, respectively.

Figure 4:
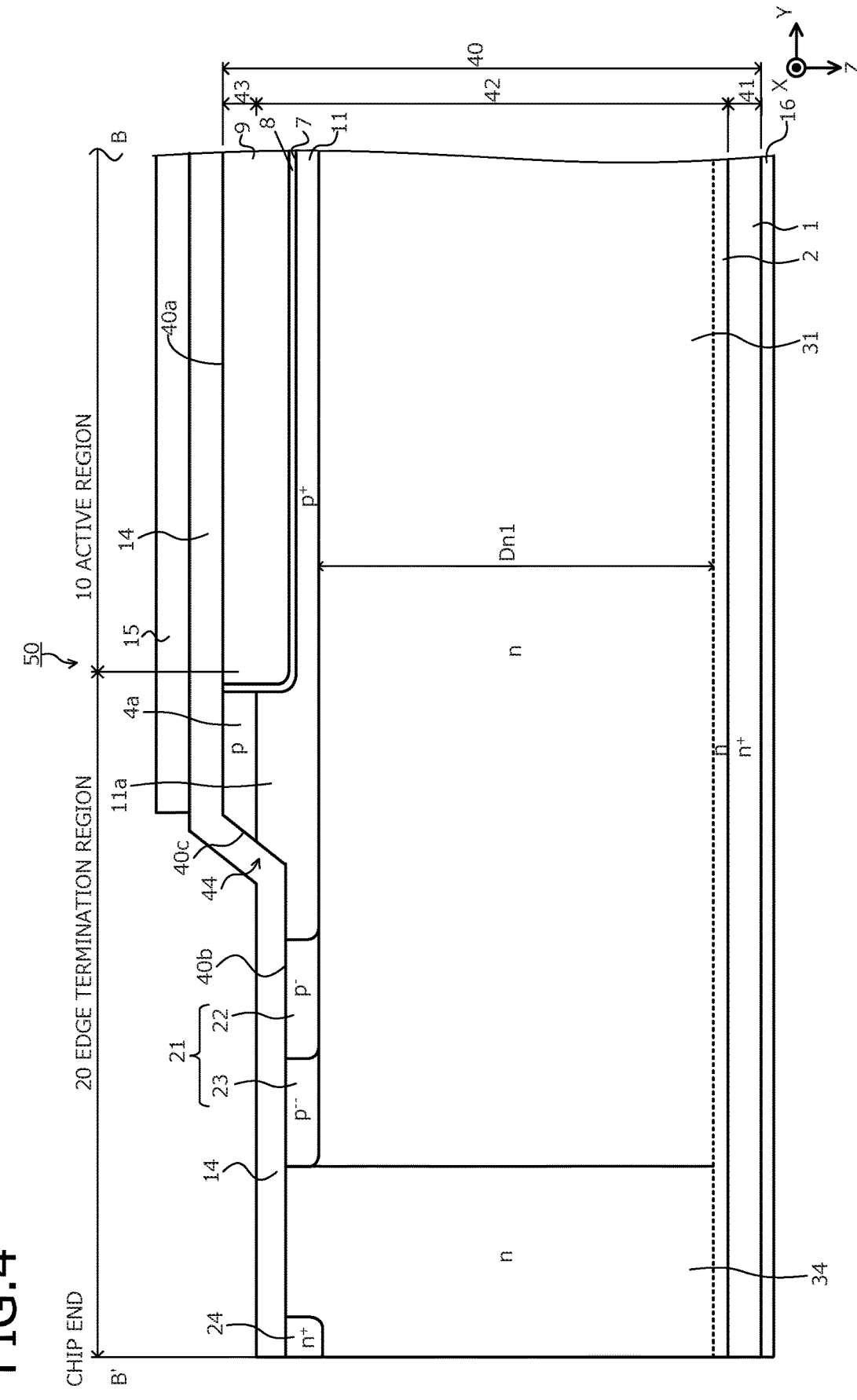
FIG. 4 is a cross-sectional view of the structure along cutting line B-B' in FIG. 1.
Figure 5:
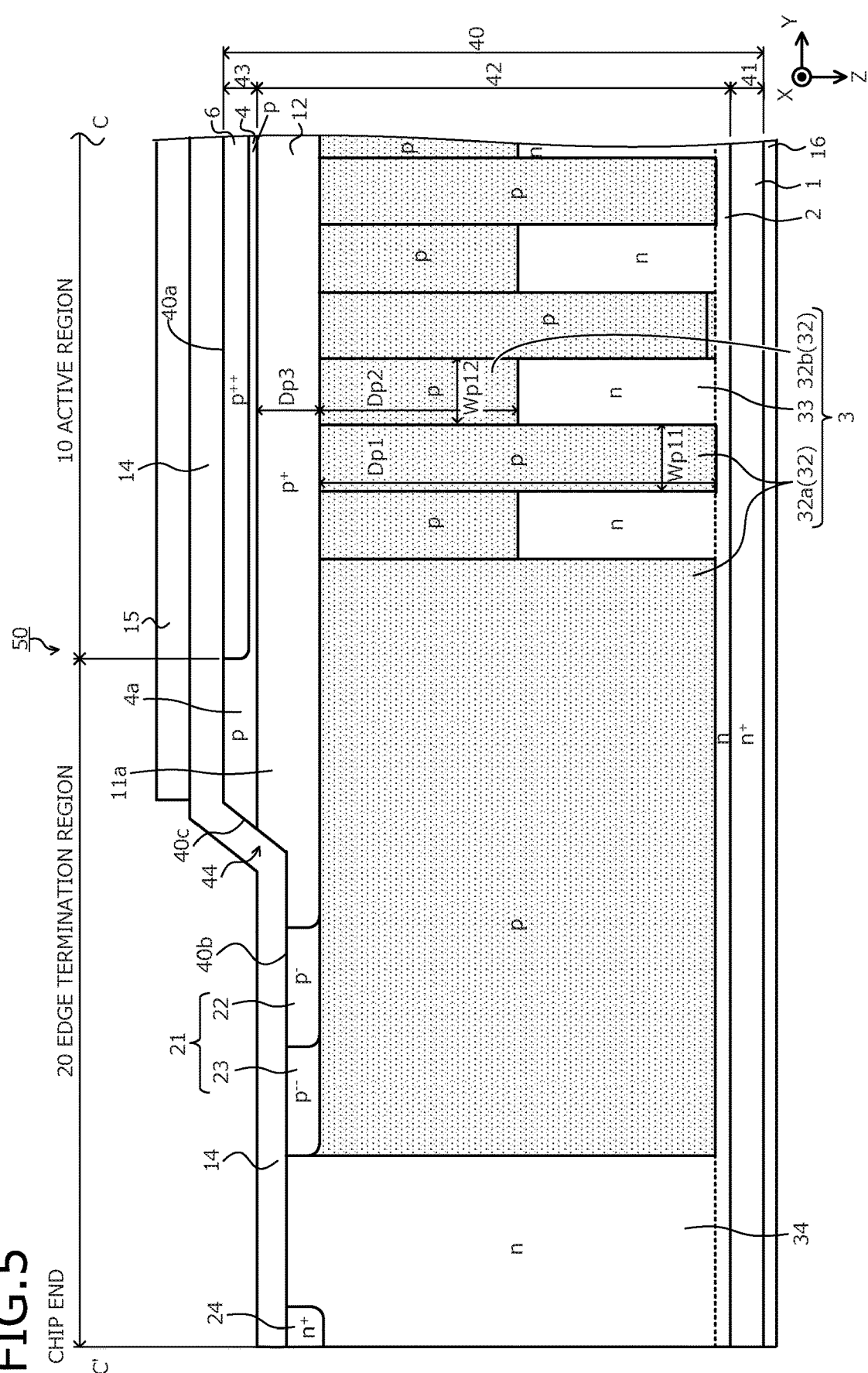
FIG. 5 is a cross-sectional view of the structure along cutting line C-C' in FIG. 1.
Figure 6:
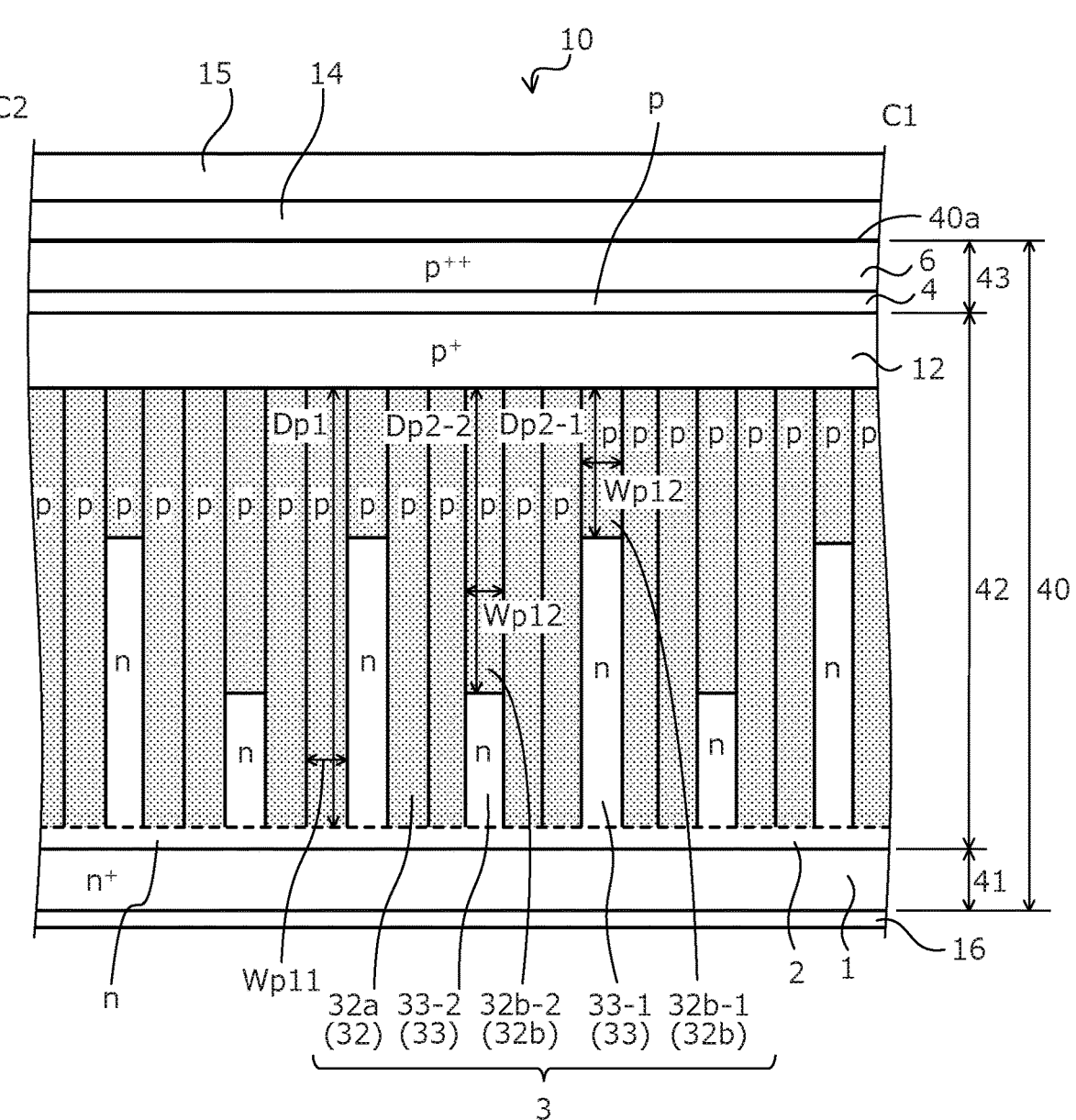
FIG. 6 is a cross-sectional view depicting another example of the structure of the active region (portion between C1-C2) along cutting line C-C' in FIG. 1.

FIGS. 4 and 5 depict cross-sections of the n-type column regions 31 and the p-type column regions 32 as viewed from the first direction X (lateral direction). FIG. 6 is a cross-sectional view depicting another example of the structure of the active region (portion between C1-C2) along cutting line C-C' in FIG. 1. In FIG. 6, the number of the n-type column regions 31 and the p-type column regions 32 of the parallel pn layer 3 is simplified and differs from that depicted in FIG. 5. In FIGS. 1 to 3, 5, and 6, the p-type column regions 32 are indicated by hatching (similarly in FIGS. 7 to 14). FIGS. 2 to 6 depict a portion of multiple unit cells (constituent units of device) that are disposed adjacent to one another in an active region 10, each has the same structure (similarly in FIGS. 7 to 14).

A silicon carbide semiconductor device 50 according to the first embodiment depicted in FIGS. 1 to 5 is a vertical MOSFET that has a SJ structure in which a drift layer (drift region) is constituted by the parallel pn layer 3, and further has a general trench gate structure (device structure) provided in an active region 10 of a semiconductor substrate 40 that contains silicon carbide (SiC), the trench gate structure being provided in the semiconductor substrate (semiconductor chip) 40, at a front surface (first main surface) thereof. As depicted in FIG. 1, the active region 10 is a region through which a main current flows when the MOSFET is in an on-state and is disposed in substantially a center (chip center) of the semiconductor substrate 40. In the active region 10, the trench gate structure is disposed between the front surface of the semiconductor substrate 40 and the parallel pn layer 3.

An edge termination region 20 is a region between the active region 10 and an end (chip end) of the semiconductor substrate 40, and surrounds a periphery of the active region 10. The edge termination region 20 mitigates electric field of an upper portion (portion relatively closer to the front surface of the semiconductor substrate 40) of the drift layer in the active region 10 and sustains the breakdown voltage. The breakdown voltage is a voltage limit at which no excessive increase in leakage current, destruction or malfunction of the device occurs. The active region 10 is a region disposed in a chip center and, in the first direction X, extends to a center of an outermost one (7a) (one closest to a chip end) gate trenches 7 (refer to FIGS. 2 and 3) and in the second direction Y, extends to ends (not depicted) of n⁺-type source regions 5 (refer to FIGS. 2 and 3).

In the edge termination region 20, a voltage withstanding structure 21 such as a field limiting ring (FLR), a mesa structure, a junction termination extension (JTE) structure, a field plate, etc. is disposed between the front surface of the semiconductor substrate 40 and the parallel pn layer (refer to FIGS. 2 to 5). FIGS. 2 to 5 depict an instance in which substantially an entire area of the front surface of the semiconductor substrate 40 in the edge termination region 20 is covered by an interlayer insulating film 14 and a double-zone structure is disposed as the voltage withstanding structure 21.

The FLR is a structure in which multiple p-type regions are disposed apart from one another in concentric shapes surrounding the periphery of the active region 10. The JTE structure is a structure in which multiple p-type regions of different impurity concentrations are adjacently disposed in descending order of impurity concentration in a direction from the active region 10 to the chip end, in concentric shapes surrounding the periphery of the active region 10. The double-zone JTE structure is a JTE structure configured by two p-type regions (later described $p^-$-type region 22 and $p^{---}$-type region 23, refer to FIGS. 2 to 5) of different impurity concentrations.

A cross-section of the structure of the SJ structure of the drift layer in the active region 10 and that in the edge termination region 20 differ from each other. The parallel pn layer 3 is formed by n-type regions (hereinafter, n-type column regions (first-conductivity-type column regions) 31 and p-type regions (hereinafter, p-type column regions (second-conductivity-type column regions))) 32 disposed adjacently so as to repeatedly alternate with one another in the first direction X, which is parallel to a main surface of the semiconductor substrate 40. The n-type column regions 31 and the p-type column regions 32, in substantially an entire area of the semiconductor substrate 40, extend in a striped pattern in the second direction Y, which is parallel to a main surface of the semiconductor substrate 40 and orthogonal to the first direction X.

In the parallel pn layer 3, the p-type column regions 32 are closest to the chip end in the first direction X. A width Wn1 of each of the n-type column regions 31 in a lateral direction (the first direction X) and a width Wp1 of each of the p-type column regions 32 in the lateral direction are uniform spanning the active region 10 and the edge termination region 20 (FIG. 1), and are uniform in the depth direction Z (refer to FIGS. 2 to 5). The width Wn1 of each of the n-type column regions 31 in the lateral direction and the width Wp1 of each of the p-type column regions 32 in the lateral direction are substantially equal. The n-type column regions 31 and the p-type column regions 32 disposed adjacent to one another extend in a longitudinal direction (the second direction Y) and have substantially a same length.

An impurity concentration of the n-type column regions 31 is uniform spanning the active region 10 and the edge termination region 20. An impurity concentration of the p-type column regions 32 is uniform spanning the active region 10 and the edge termination region 20. The impurity concentration of the n-type column regions 31 and the impurity concentration of the p-type column regions 32 are substantially equal. Substantially equal widths, substantially equal depths, and substantially equal impurity concentrations means, respectively, substantially equal widths, substantially equal depths, and substantially equal impurity concentrations within ranges that include allowable error due to process variation.

As depicted in FIGS. 2 to 5, the semiconductor substrate 40 is formed by sequentially depositing, on a front surface of a $n^+$-type starting substrate 41 containing silicon carbide, epitaxial layers 42, 43 that constitute the drift layer and a p-type base region 4. The semiconductor substrate 40 has, as a front surface, a main surface that has the p-type epitaxial layer 43 and, as a back surface (second main surface), a main surface that has the $n^+$-type starting substrate 41. The $n^+$-type starting substrate 41 constitutes the $n^+$-type drain region 1. The drift layer (the n-type epitaxial layer 42) is provided between and in contact with the p-type base region 4 and the $n^+$-type drain region 1.

In the drift layer, at least a surface region thereof facing the front surface of the semiconductor substrate 40 constitutes the parallel pn layer 3. As described above, the parallel pn layer 3 is a SJ structure in which the n-type column regions 31 and the p-type column regions 32 are adjacently disposed so as to repeatedly alternate one another in the first direction X, which is parallel to the front surface of the semiconductor substrate 40. A portion of the drift layer between the parallel pn layer 3 and the $n^+$-type drain region 1 may constitute an n-type buffer region (n-type region not constituting the SJ structure) 2. An impurity concentration of the n-type buffer region 2 is not more than the impurity concentration of the n-type column regions 31.

The n-type column regions 31 reach the n-type buffer region 2 (in an instance in which the n-type buffer region 2 is omitted, the $n^+$-type drain region 1) in the depth direction Z. A length Dn1 of the n-type column regions 31 in the depth direction Z is uniform in an entire area spanning the active region 10 and the edge termination region 20. In the active region 10, the length Dn1 of the n-type column regions 31 in the depth direction Z is a length from an interface between one of the n-type column regions 31 and a $p^+$-type region 11 directly beneath (direction to the $n^+$-type drain region 1) one of the later described gate trenches 7 to an interface between said one of the n-type column regions 31 and the n-type buffer region 2 (in an instance in which the n-type buffer region 2 is omitted, the $n^+$-type drain region 1).

In the edge termination region 20, the length Dn1 of the n-type column regions 31 in the depth direction Z is a length from an interface between one of the n-type column regions 31 and the voltage withstanding structure 21 (the $p^-$-type region 22, the $p^{---}$-type region 23) or a later described $p^+$-type extension portion 11$a$ to an interface between said one of the n-type column regions 31 and the n-type buffer region 2 (in an instance in which the n-type buffer region 2 is omitted, the $n^+$-type drain region 1). The width Wn1 of each of the n-type column regions 31 in the lateral direction is wider than a width of each of the $p^+$-type regions 11 in the lateral direction. The n-type column regions 31 may be in contact with $p^+$-type regions 12 between the later described gate trenches 7 that are adjacent to one another.

The p-type column regions 32, in the active region 10, include ones (hereinafter, short p-type column regions (short column regions, or second-length column regions) 32$b$ that extend linearly in the second direction Y and the length Dp2 thereof in the depth direction Z is shorter than that of others (hereinafter, long p-type column regions, or first-length column regions) 32$a$. The long p-type column regions 32$a$ reach the n-type buffer region 2 (in an instance in which the n-type buffer region 2 is omitted, the $n^+$-type drain region 1) in the depth direction Z. The length Dp1 of the long p-type column regions 32$a$ in the depth direction Z is substantially equal to the length Dn1 of the n-type column regions 31 in the depth direction Z.

The short p-type column regions 32$b$ do not reach (are apart from) the n-type buffer region 2 (in an instance in which the n-type buffer region 2 is omitted, the $n^+$-type drain region 1) in the depth direction Z. The short p-type column regions 32$b$ are scattered in the second direction Y, in the active region 10. The short p-type column regions 32$b$ may be disposed adjacent to another of the short p-type column regions 32$b$ of the p-type column regions 32 in the first direction X (refer to FIG. 3), the short p-type column regions 32$b$ may be disposed adjacent to one of the long p-type column regions 32$a$ of the p-type column regions 32 in the first direction X (not depicted).

Between the short p-type column regions 32*b* and the n-type buffer region 2, n-type column regions 33 are provided in contact with these regions, the long p-type column regions 32*a*, and the n-type column regions 31. The n-type column regions 33 configure the parallel pn layer 3. An impurity concentration of the n-type column regions 33 is uniform and is substantially equal to the impurity concentration of the n-type column regions 31. The length Dp1 of the long p-type column regions 32*a* in the depth direction Z and the length Dp2 of the short p-type column regions 32*b* in the depth direction Z are both longer than a length Dp3 of the p$^+$-type regions 11 in the depth direction Z, the p$^+$-type regions 11 being directly beneath the gate trenches 7.

In the active region 10, the length Dp1 of the long p-type column regions 32*a* in the depth direction Z is a length from an interface between one of the long p-type column regions 32*a* and one of the p$^+$-type regions 12 between an adjacent two of the later described gate trenches 7 to an interface between said one of the long p-type column regions 32*a* and the n-type buffer region 2 (in an instance in which the n-type buffer region 2 is omitted, the n$^+$-type drain region 1). The length Dp2 of the short p-type column regions 32*b* in the depth direction Z is a length from an interface between one of the short p-type column regions 32*b* and one of the p$^+$-type regions 12 to an interface between said one of the short p-type column regions 32*b* and one of the n-type column regions 33.

In the edge termination region 20, the length Dp1 of the long p-type column regions 32*a* in the depth direction Z is a length from an interface between one of the long p-type column regions 32*a* and the voltage withstanding structure 21 or the p$^+$-type extension portion 11*a* to an interface between said one of the long p-type column regions 32*a* and the n-type buffer region 2 (in an instance in which the n-type buffer region 2 is omitted, the n$^+$-type drain region 1). The width Wp1 (Wp1-1, Wp1-2) of each of the p-type column regions 32 in the lateral direction may be substantially equal to a width of the p$^+$-type regions 12 in the lateral direction. The length Dp3 of the p$^+$-type regions 11 in the depth direction Z is a length from an upper end (end facing the n$^+$-type source regions 5) of each of the p$^+$-type regions 11 to a lower end (end facing the n$^+$-type drain region 1) of each of the p$^+$-type regions 11.

In the active region 10, the long p-type column regions 32*a* and the short p-type column regions 32*b* are disposed so as to repeatedly alternate with one another in the second direction Y (refer to FIG. 5). Upper ends of the long p-type column regions 32*a* and upper ends of the short p-type column regions 32*b* are positioned at substantially the same depth. Lower ends of the long p-type column regions 32*a* reach positions closer to the n$^+$-type drain region 1 than are lower ends of the short p-type column regions 32*b*. The width Wp1-1 of the long p-type column regions 32*a* in the lateral direction and the width Wp1-2 of the short p-type column regions 32*b* in the lateral direction are substantially equal to each other.

A width Wp11 of the long p-type column regions 32*a* in the longitudinal direction may be suitably set, may be substantially equal to a width Wp12 of the short p-type column regions 32*b* in the longitudinal direction, and/or may be substantially equal to the width Wp1-1 of the long p-type column regions 32*a* in the lateral direction. A thickness of the parallel pn layer 3 is determined by the length Dp1 of the long p-type column regions 32*a* in the depth direction Z. In an instance in which the n-type buffer region 2 is provided, the long p-type column regions 32*a* may reach a position closer to the n$^+$-type drain region 1 in the depth direction Z than are the n-type column regions 31.

In this manner, in the active region 10, the length of the p-type column regions 32 in the depth direction Z is shorter in a cross-section parallel to the first direction X and passing through the short p-type column regions 32*b* (cutting line A2-A2') as compared to a cross-section parallel to the first direction X and passing through the long p-type column regions 32*a* (cutting line A1-A1'). In the active region 10, in a cross-section (cutting line C-C') viewed from the lateral direction, the p-type column regions 32 form a comb-like shape due to the difference in the lengths of the long p-type column regions 32*a* and the short p-type column regions 32*b* in the depth direction Z.

On the other hand, the length Dn1 of the n-type column regions 31 in the depth direction Z is uniform in an entire area of the active region 10. Therefore, in the active region 10, due to the short p-type column regions 32*b* disposed only in an upper portion (portion relatively closer to the front surface of the semiconductor substrate 40 and the n$^+$-type source regions 5 than is a lower portion) of the parallel pn layer 3, the upper portion of the parallel pn layer 3 is relatively p-rich while the lower portion (portion relatively closer to the back surface of the semiconductor substrate 40 and the n$^+$-type drain region 1 than is the upper portion) of the parallel pn layer 3 is relatively n-rich due to the n-type column regions 33 disposed facing the short p-type column regions 32*b* in the depth direction Z.

In the active region 10, "p-rich" is a state in which an amount of charge expressed by a product obtained by multiplying the carrier concentration and the width Wp1 in the lateral direction of the p-type column regions 32 (the long p-type column regions 32*a* and the short p-type column regions 32*b*) is greater than an amount of charge expressed by a product obtained by multiplying the carrier concentration and the width Wn1 in the lateral direction of the n-type column regions 31, 33. "N-rich" is a state in which an amount of charge expressed by a product obtained by multiplying the carrier concentration and the width Wn1 in the lateral direction of the n-type column regions 31, 33 is greater than an amount of charge expressed by a product obtained by multiplying the carrier concentration and the width Wp1 in the lateral direction of the p-type column regions 32 (the long p-type column regions 32*a* and the short p-type column regions 32*b*).

Further, in the active region 10, the respective widths Wp1-1, Wp1-2 of the long p-type column regions 32*a* and the short p-type column regions 32*b* in the lateral direction are substantially equal to each other. Thus, in the active region 10, in a portion of the parallel pn layer 3, from a side thereof facing the front surface of the semiconductor substrate 40 to an interface between the short p-type column regions 32*b* and the n-type column regions 33, equilibrium between the charge of the n-type column regions 31 and the charge of the p-type column regions 32 is roughly maintained while a portion of the parallel pn layer 3 closer to the back surface of the semiconductor substrate 40 than is the interface between the short p-type column regions 32*b* and the n-type column regions 33 is relatively n-rich.

In the edge termination region 20, the p-type column regions 32 include only the long p-type column regions 32*a*. The width Wp1-1 in the lateral direction and the length Dp1 in the depth direction Z of the long p-type column regions 32*a* are substantially equal to the width Wn1 in the lateral direction and the length Dn1 in the depth direction Z of each of the n-type column regions 31 and thus, in the edge termination region 20, equilibrium of the charge of the n-type column regions 31 and of the p-type column regions 32 is roughly maintained. Thus, the lower portion of the parallel pn layer 3 relatively closer to the back surface of the semiconductor substrate 40 is n-rich to a greater extent in the active region 10 as compared to the edge termination region 20.

In the active region 10, charge balance is an index indicating a degree of equilibrium between an amount of charge expressed by a product obtained by multiplying the carrier concentration and the width Wn1 of the n-type column regions 31, 33 and an amount of charge expressed by a product obtained by multiplying the carrier concentration and the width Wp1 of the p-type column regions 32. In the edge termination region 20, charge balance is an index indicating a degree of equilibrium between an amount of charge expressed by a product obtained by multiplying the carrier concentration and the width Wn1 of the n-type column regions 31 and an amount of charge expressed by a product obtained by multiplying the carrier concentration and the width Wp1 of the p-type column regions 32.

In the active region 10, the charge balance between the n-type column regions 31, 33 and the p-type column regions 32 is adjusted by changing the length Dp2 of the short p-type column regions 32b in the depth direction Z, or the width Wp11 of the long p-type column regions 32a in the longitudinal direction, or both. In the active region 10, the upper portion of the parallel pn layer 3 is set to be relatively p-rich, whereby decreases in the breakdown voltage of the active region 10 may be reduced as compared to the conventional structure (refer to FIGS. 15 to 18). As a result, the breakdown voltage of the active region 10 may be set to be lower than the breakdown voltage of the edge termination region 20. Further, a margin for the breakdown voltage of the active region 10 may be increased.

Further, this is equivalent to a state in which a normal SJ structure in which the long p-type column regions 32a and the short p-type column regions 32b are disposed so as to repeatedly alternate with one another in the second direction Y and thus, the length Dp1 of the p-type column regions 32 (the long p-type column regions 32a) in the depth direction Z is substantially equal to the length Dn1 of the n-type column regions 31 in the depth direction Z, and a short SJ structure in which the length Dp2 of the p-type column regions 32 (the short p-type column regions 32b) in the depth direction Z is shorter than the length Dn1 of the n-type column regions 31 in the depth direction Z are connected in parallel in the second direction Y, in the active region 10. As a result, both reduction of the on-resistance by the normal SJ structure and enhancement of switching characteristics by the short SJ structure may be realized.

The length Dp2 of the short p-type column regions 32b in the depth direction Z may be longer than the length Dp3 in the depth direction Z of the p+-type regions 11 directly beneath the gate trenches 7 and, for example, may be shortened to about 3% of the length Dp1 of the long p-type column regions 32a in the depth direction Z. A volume of the p-type column regions 32 (the long p-type column regions 32a and the short p-type column regions 32b) preferably may be about 20% or more, but less than 90% of a total volume of the n-type column regions 31, 33 and more preferably, may be in a range of about 50% to 70% of the total volume of the n-type column regions 31, 33.

When a ratio of the volume of the p-type column regions 32 to the total volume of the n-type column regions 31, 33 is less than 20%, in the active region 10, the parallel pn layer 3 becomes excessively n-rich and the breakdown voltage decreases and thus, is undesirable. On the other hand, when the ratio of the volume of the p-type column regions 32 to the total volume of the n-type column regions 31, 33 exceeds 90%, in the active region 10, the parallel pn layer 3 becomes excessively p-rich and the breakdown voltage decreases and thus, is undesirable. Further, the ratio of the volume of the p-type column regions 32 to the total volume of the n-type column regions 31, 33 is set to be in a range of about 50% to 70%, whereby the margin for the breakdown voltage in an instance of deviation from a predetermined positioning condition in the first direction X for the p+-type regions 12 and the p-type column regions 32 may be widened.

The charge balance between the n-type column regions 31, 33 and the p-type column regions 32 in the active region 10 may be adjusted by disposing, in the active region 10, two or more types of the short p-type column regions 32b, the length Dp2 in the depth direction Z differs for each of the types (refer to FIG. 6). The long p-type column regions 32a and the two or more types of the short p-type column regions 32b are disposed regularly in the second direction Y. Between the two or more types of the short p-type column regions 32b and the n-type buffer region 2, the n-type column regions 33 of lengths corresponding to a distance from a corresponding one of the short p-type column regions 32b to the n-type buffer region 2 in the depth direction are disposed.

For example, FIG. 6 depicts an instance in which two types of the short p-type column regions 32b (32b-1, 32b-2) for which the length Dp2 (Dp2-1, Dp2-2) in the depth direction Z differs are disposed. Between the short p-type column regions 32b-1, 32b-2 and the n-type buffer region 2, the n-type column regions 33 (33-1, 33-2) are respectively disposed. The respective lengths Dp2-1, Dp2-2 of the short p-type column regions 32b-1, 32b-2 in the depth direction Z may be set, respectively, as about ⅓ and about ⅔ of the length Dp1 of the long p-type column regions 32a in the depth direction Z.

The trench gate structure is configured by the p-type base region (first semiconductor region) 4, the n+-type source regions (second semiconductor regions) 5, p++-type contact regions 6, the gate trenches (trenches) 7, gate insulating films 8, and gate electrodes 9. The p-type base region 4 is provided between the front surface of the semiconductor substrate 40 and the parallel pn layer 3. The p-type base region 4 is a portion of the p-type epitaxial layer 43 excluding the n+-type source regions 5 and the p++-type contact regions 6. The p-type base region 4 extends from the active region 10 to a later described recess 44.

The n+-type source regions 5 and the p++-type contact regions 6 are each selectively provided in the active region 10, between the front surface of the semiconductor substrate 40 and the p-type base region 4. The n+-type source regions 5 and the p++-type contact regions 6 are in contact with the p-type base region 4 and are exposed at the front surface of the semiconductor substrate 40. Being exposed at the front surface of the semiconductor substrate 40 means that the n+-type source regions 5 and the p++-type contact regions 6 are in contact with a later described source electrode (first electrode)) 15, at a later described first portion 40a of the front surface of the semiconductor substrate 40.

The n+-type source regions 5 and the p++-type contact regions 6, for example, extend linearly in the second direction Y along sidewalls of the gate trenches 7. The n+-type source regions 5 are disposed closer to the gate trenches 7 than are the p++-type contact regions 6 and face the gate electrodes 9 across the gate insulating films 8 at the sidewalls of the gate trenches 7. The p++-type contact regions 6 may be omitted. In this instance, instead of the p++-type contact regions 6, the p-type base region 4 is exposed at the later described first portion 40a of the front surface of the semiconductor substrate 40.

Between the p-type base region 4 and the parallel pn layer 3, $p^+$-type regions (first and second second-conductivity-type high-concentration regions) 11, 12 are each selectively provided. The $p^+$-type regions 11, 12 are diffused regions formed in the n-type epitaxial layer 42 by ion implantation. The $p^+$-type regions 11, 12 are electrically connected to the source electrode 15, deplete when the MOSFET is off, and have a function of mitigating electric field close to bottoms of the gate trenches 7. The $p^+$-type regions 11, 12 extend in a striped pattern in the second direction Y along the side-walls of the gate trenches 7.

The n-type column regions 31 extend between the $p^+$-type regions 11, 12. Between the $p^+$-type regions 11, 12, the n-type column regions 31 extend to the p-type base region 4 and are in contact with the p-type base region 4. The $p^+$-type regions 11 are disposed apart from the p-type base region 4 and face the bottoms of the gate trenches 7 in the depth direction Z. The $p^+$-type regions 11 are connected to the $p^+$-type regions 12 by a non-depicted portion. The $p^+$-type regions 11 face and are in contact with the n-type column regions 31 in the depth direction Z. The $p^+$-type regions 11 may be in contact with the gate insulating films 8 at the bottoms of the gate trenches 7.

An outermost one of the $p^+$-type regions 11 extends closer to the chip end than is the later described recess 44 and is exposed at a later described second portion 40b of the front surface of the semiconductor substrate 40. Being exposed at later described second and third portions 40b, 40c of the front surface of the semiconductor substrate 40 means being in contact with the interlayer insulating film 14 on the front surface of the semiconductor substrate 40. Each of the $p^+$-type regions 12 is in contact with the p-type base region 4 between an adjacent two of the gate trenches 7 and is provided apart from the $p^+$-type regions 11 and the gate trenches 7. The $p^+$-type regions 12 face and are in contact with the p-type column regions 32 in the depth direction Z.

Between the gate trenches 7 that are adjacent to one another, and between the $p^+$-type regions 11, 12, the p-type base region 4, and the n-type column regions 31, an n-type current spreading region (not depicted) may be provided so as to be in contact with these regions and reach the sidewalls of the gate trenches 7 in the first direction X. The n-type current spreading region is a so-called current spreading layer (CSL) that reduces carrier spreading resistance. An impurity concentration of the n-type current spreading region is at least equal to the impurity concentration of the n-type column regions 31.

The gate trenches 7 penetrate through the $n^+$-type source regions 5 and the p-type base region 4 in the depth direction Z from the later described first portion 40a of the front surface of the semiconductor substrate 40 and reach the n-type column regions 31 (in an instance in which the n-type current spreading region is provided, the n-type current spreading region). The bottoms of the gate trenches 7 may terminate in the $p^+$-type regions 11, respectively. The gate trenches 7 extend in a striped pattern in a direction parallel to the front surface of the semiconductor substrate 40 (herein, the second direction Y). The gate electrodes 9 are provided in the gate trenches 7, via the gate insulating films 8.

The interlayer insulating film 14 is provided in an entire area of the front surface of the semiconductor substrate 40 and covers the gate electrodes 9. The source electrode 15 is in ohmic contact with the later described first portion 40a of the front surface of the semiconductor substrate 40 in contact holes of the interlayer insulating film 14 and is electrically connected to the p-type base region 4, the $n^+$-type source regions 5, and the $p^{++}$-type contact regions 6. A drain electrode (second electrode) 16 is provided in an entire area of the back surface (back surface of the $n^+$-type starting substrate 41) of the semiconductor substrate 40 and is electrically connected to the $n^+$-type drain region 1.

A portion of the p-type epitaxial layer 43 in the edge termination region 20 is removed by etching and the recess 44 is formed at the front surface of the semiconductor substrate 40. With the recess 44 as a border, the front surface of the semiconductor substrate 40 is recessed toward the $n^+$-type drain region 1 at the portion (second portion) 40b in the edge termination region 20, as compared to the portion (first portion) 40a in the active region 10. The second portion 40b of the front surface of the semiconductor substrate 40 is an exposed surface of the n-type epitaxial layer 42 that is exposed by the removal of the p-type epitaxial layer 43.

Devices of the active region 10 and the edge termination region 20 are separated by a portion (third portion: mesa edge of the recess 44) 40c that connects the first portion 40a and the second portion 40b of the front surface of the semiconductor substrate 40. In the edge termination region 20, a field oxide film may be provided between the front surface of the semiconductor substrate 40 and the interlayer insulating film 14. In the semiconductor substrate 40 at the front surface thereof, the p-type base region 4 and an outermost one of the $p^+$-type regions 11 facing the bottom of an outermost one (7a) of the gate trenches 7 extend in the edge termination region 20, from the active region 10.

Hereinafter, portions of the p-type base region 4 and the $p^+$-type regions 11 extending into the edge termination region 20 are assumed to be a p-type base extension portion 4a and the $p^+$-type extension portion 11a. The p-type base extension portion 4a and the $p^+$-type extension portion 11a surround the periphery of the active region 10. Between the first portion 40a of the front surface of the semiconductor substrate 40 and the p-type base extension portion 4a, a $p^{++}$-type outer peripheral contact region (not depicted) may be provided. The $p^{++}$-type outer peripheral contact region and the p-type base extension portion 4a are electrically connected to the source electrode 15 in contact holes of the interlayer insulating film 14.

The $p^+$-type extension portion 11a extends along a border between the active region 10 and the edge termination region 20 and surrounds the periphery of the active region 10. The $p^+$-type extension portion 11a is further provided between and in contact with the p-type base extension portion 4a and the parallel pn layer 3. The $p^+$-type extension portion 11a and ends of all the $p^+$-type regions 11, 12 of the active region 10 are connected. Further, the $p^+$-type extension portion 11a extends closer to the chip end than is the recess 44 of the front surface of the semiconductor substrate 40 and is exposed at the second portion 40b of the front surface of the semiconductor substrate.

A gate runner (not depicted) is provided between the active region 10 and the voltage withstanding structure 21. The gate runner includes a gate polysilicon wiring layer provided on the first portion 40a of the front surface of the semiconductor substrate 40, via the field oxide film (not depicted). The gate polysilicon wiring layer is covered by the interlayer insulating film 14. The gate polysilicon wiring layer is connected to the gate electrodes 9 of all the unit cells of the active region 10. The gate runner electrically connects the gate electrodes 9 and the gate pad (electrode: not depicted).

In the semiconductor substrate 40, at the second portion 40*b* of the front surface thereof, multiple p-type regions configuring the voltage withstanding structure 21 are selectively provided in the n-type epitaxial layer 42, and closer to the chip end than are the p-type regions configuring the voltage withstanding structure 21, an n⁺-type channel stopper region 24 is selectively provided apart from the voltage withstanding structure 21. The voltage withstanding structure 21, for example, is a double-zone JTE structure in which two p-type regions (the p⁻-type region 22, the p⁻⁻-type region 23) of different impurity concentrations are disposed adjacent to each other in descending order of impurity concentration in a direction from the active region 10 to the chip end, in concentric shapes that surround the periphery of the active region 10.

The p-type region 22 that is innermost among the p-type regions configuring the voltage withstanding structure 21 is in contact with the p⁺-type extension portion 11*a* in a direction parallel to the front surface of the semiconductor substrate 40. The p-type regions configuring the voltage withstanding structure 21 are fixed to a potential of the source electrode 15 via the p⁺-type extension portion 11*a* and the p-type base extension portion 4*a*. The p-type regions configuring the voltage withstanding structure 21 and the n⁺-type channel stopper region 24 are diffused regions formed in the n-type epitaxial layer 42 by ion implantation and are exposed at the second portion 40*b* of the front surface of the semiconductor substrate 40.

Instead of the n⁺-type channel stopper region 24, a p⁺-type channel stopper region (not depicted) may be disposed. A normal n-type drift region 34 free of the SJ structure is between the voltage withstanding structure 21 and the n⁺-type channel stopper region 24. The normal n-type drift region 34 is exposed at the second portion 40*b* of the front surface of the semiconductor substrate 40 and a side surface of the semiconductor substrate 40. The normal n-type drift region 34 is in contact with the parallel pn layer 3 and surrounds a periphery of the parallel pn layer 3. An impurity concentration of the normal n-type drift region 34 is not more than the impurity concentration of the n-type column regions 31.

A method of manufacturing the silicon carbide semiconductor device 50 according to the first embodiment is described. First, on the front surface of the n⁺-type starting substrate (semiconductor wafer) 41 that constitutes the n⁺-type drain region 1, the drift layer that includes the parallel pn layer 3 is formed. At this time, for example, a multistage epitaxial method is used in which epitaxial growth of the n-type epitaxial layer 42 that constitutes the drift layer is separated into multiple stages (sessions) and at each stage, a p-type impurity such as aluminum (Al) is ion-implanted in the formed n-type epitaxial layer, whereby portions constituting the p-type column regions 32 (the long p-type column regions 32*a* and the short p-type column regions 32*b*) of the parallel pn layer 3 are selectively formed.

Portions of the n-type epitaxial layer 42 between the p-type column regions 32 that are adjacent to one another are free of ion implantation and thereby remain as an n-type and constitute the n-type column regions 31 of the parallel pn layer 3. Remaining portions of the n-type epitaxial layer 42 directly beneath the short p-type column regions 32*b* constitute the n-type column regions 33 of the parallel pn layer 3. An entire area of a portion of the n-type epitaxial layer 42 between the parallel pn layer 3 and the n⁺-type starting substrate 41 is free of ion implantation and may be left as the n-type buffer region 2. Hereinafter, an instance in which the n-type buffer region 2 is provided is described as an example. A portion between the parallel pn layer 3 and the chip end (end of portion constituting the semiconductor chip) is free of ion implantation and thereby, left as an n-type to constitute the normal n-type drift region 34.

The n-type column regions 31, 33 may be formed by ion implantation of an n-type impurity. In this instance, instead of the n-type epitaxial layer 42, non-doped epitaxial layers or n'-type epitaxial layers are epitaxially grown in multiple stages. In an instance in which non-doped epitaxial layers are epitaxially grown in multiple stages, the n-type buffer region 2 and the n-type drift region 34 are formed by ion implantation of an n-type impurity. In an instance in which n-type epitaxial layers are epitaxially grown in multiple stages, the n-type buffer region 2 and the n-type drift region 34 may be each formed to have an impurity concentration that is lower than the impurity concentration of the n-type column regions 31.

Next, by ion implantation, in the n-type epitaxial layer 42, at the surface thereof, the p⁺-type regions 11, 12 are selectively formed adjacent to the n-type column regions 31 and the p-type column regions 32, respectively, in the depth direction Z. Further, the p⁺-type extension portion 11*a* is formed concurrently with the p⁺-type regions 11. An uppermost n-type epitaxial layer of the n-type epitaxial layer 42 formed by multiple stages of epitaxial growth may be free of the n-type column regions 31 and the p-type column regions 32, only the p⁺-type regions 11, 12 and the p⁺-type extension portion 11*a* may be formed therein, and by ion implantation, the n-type current spreading region (not depicted) may be formed between the p⁺-type regions 11, 12 that are adjacent to one another.

Next, the p-type epitaxial layer 43, which constitutes the p-type base region 4, is epitaxially grown on the n-type epitaxial layer 42. As a result, the semiconductor substrate (semiconductor wafer) 40 is fabricated in which the epitaxial layers 42, 43 are sequentially stacked on the n⁺-type starting substrate 41 and the n-type epitaxial layer 42 includes the parallel pn layer 3. Next, a portion of the p-type epitaxial layer 43 in the edge termination region 20 is removed by etching, thereby forming at the front surface of the semiconductor substrate 40, the recess 44 where a portion (the second portion 40*b*) in the edge termination region 20 is lower than a portion (the first portion 40*a*) in the active region 10.

In the edge termination region 20, at the newly formed second portion 40*b* of the front surface of the semiconductor substrate 40, the n-type epitaxial layer 42 is exposed. A portion (the third portion 40*c*) of the front surface of the semiconductor substrate 40, between the first portion 40*a* and the second portion 40*b*, for example, may form sharp angles with (be steeply inclined with respect to) the first and second portions 40*a*, 40*b* or may form a substantially right angle therewith (may form a plane orthogonal thereto). The p-type base region 4 and the p⁺-type extension portion 11*a* are exposed at the second and third portions 40*b*, 40*c* of the front surface of the semiconductor substrate 40. Due to the etching for forming the recess 44, the n-type epitaxial layer 42 may be slightly removed with the p-type epitaxial layer 43.

Next, by ion implantation, the n⁺-type source regions 5, the p⁺⁺-type contact regions 6, multiple p-type regions (the p-type region 22, the p⁻⁻-type region 23) of the voltage withstanding structure 21 and the n⁺-type channel stopper region 24 are each selectively formed. The n⁺-type source regions 5 and the p⁺⁺-type contact regions 6 are each selectively formed in the p-type epitaxial layer 43, at the surface thereof. The p⁺⁺-type outer peripheral contact region may be formed concurrently with the p$^{++}$-type contact regions 6. Portions of the p-type epitaxial layer 43, excluding the n$^{+}$-type source regions 5, the p$^{++}$-type contact regions 6, and the p$^{++}$-type outer peripheral contact region, constitute the p-type base region 4 and the p-type base extension portion 4a.

The p-type regions of the voltage withstanding structure 21 and the n$^{+}$-type channel stopper region 24 are each selectively formed in the n-type epitaxial layer 42, at the surface thereof exposed at the second portion 40b of the front surface of the semiconductor substrate 40 in the edge termination region 20. A sequence in which the n$^{+}$-type source regions 5, the p$^{++}$-type contact regions 6, the p$^{++}$-type outer peripheral contact region, the p-type regions of the voltage withstanding structure 21, and the n$^{+}$-type channel stopper region 24 are formed may be interchanged. Further, the n$^{+}$-type source regions 5, the p$^{++}$-type contact regions 6, and the p$^{++}$-type outer peripheral contact region may be formed before the recess 44 is formed at the front surface of the semiconductor substrate 40.

Next, a heat treatment for activating the impurities ion-implanted in the epitaxial layers 42, 43 is performed. The heat treatment may be performed each time diffused regions are formed by ion implantation. Next, the gate trenches 7 that penetrate through the n$^{+}$-type source regions 5 and the p-type base region 4 from the front surface of the semiconductor substrate 40 and face the p$^{+}$-type regions 11, respectively, are formed. Next, by a general method, the gate insulating films 8, the gate electrodes 9, the interlayer insulating film 14, the source electrode 15, and the drain electrode 16 are formed. Thereafter, the semiconductor wafer (the semiconductor substrate 40) is diced (cut) into individual chips, whereby the silicon carbide semiconductor device 50 depicted in FIGS. 1 to 5 is completed.

In the described method of manufacturing the silicon carbide semiconductor device 50 according to the first embodiment, instead of the multistage epitaxial method, a trench filling epitaxial method may be used to form the parallel pn layer 3. In an instance in which the trench filling epitaxial method is used, trenches (SJ trenches) of a depth equal to the length Dp1 of the long p-type column regions 32a in the depth direction Z, and SJ trenches of a depth equal to the length Dp2 of the short p-type column regions 32b in the depth direction Z are formed in the n-type epitaxial layer 42, portions that constitute the n-type column regions 31, 33 are left, and the SJ trenches are filled with a p-type epitaxial layer that constitutes the p-type column regions 32, whereby the parallel pn layer 3 is formed.

As described above, according to the first embodiment, in the active region, p-type column regions of the parallel pn layer include short p-type column regions that have a shorter length in the depth direction than others (long p-type column regions), whereby in the active region, the parallel pn layer is relatively p-rich in the upper portion thereof relatively closer to the front surface of the semiconductor substrate and is relatively n-rich in the lower portion thereof relatively closer to the back surface of the semiconductor substrate. In the active region, the parallel pn layer is configured to be relatively p-rich in the upper portion thereof that is relatively closer to the front surface of the semiconductor substrate, whereby in the active region, concentration of electric field at the bottoms of the short p-type column regions may be increased and thus, the breakdown voltage of the active region may be lower than the breakdown voltage of the edge termination region.

As a result, avalanche breakdown may be induced in the active region, which has a large area and occupies a majority of the area (surface area) of the semiconductor substrate, whereby resistance to destruction may be enhanced as compared to the conventional structure in which avalanche breakdown occurs in the edge termination region. In the active region, the upper portion of the parallel pn layer relatively closer to the front surface of semiconductor substrate is relatively p-rich, whereby switching characteristics may be enhanced. Further, according to the first embodiment, both reduction of on-resistance obtained by the normal SJ structure due to the long p-type column regions and enhancement of the switching characteristics by the short SJ structure due to the short p-type column regions may be realized.

Figure 7:
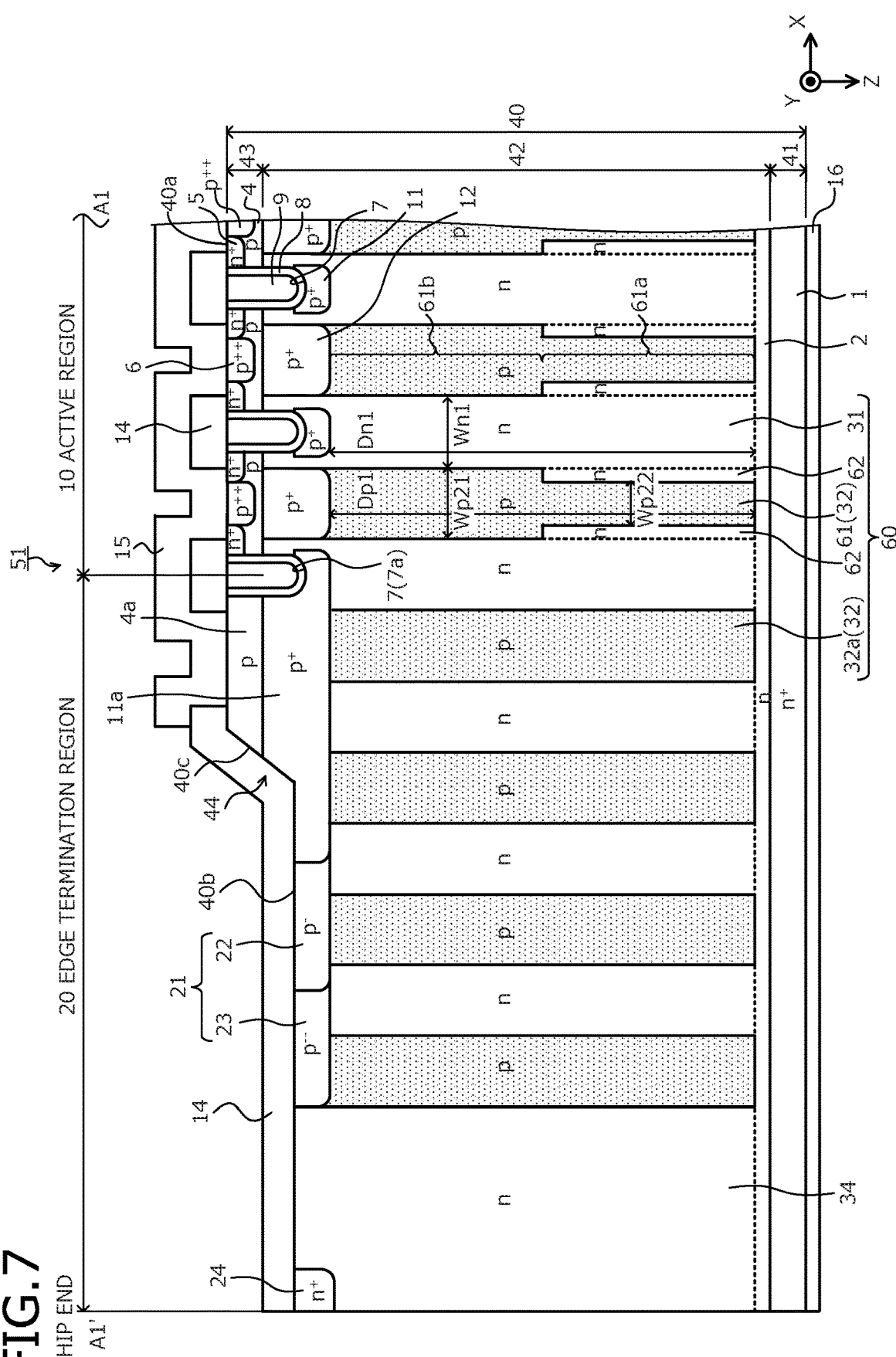
FIG. 7 is a cross-sectional view of a structure of a silicon carbide semiconductor device according to a second embodiment.
Figure 8:
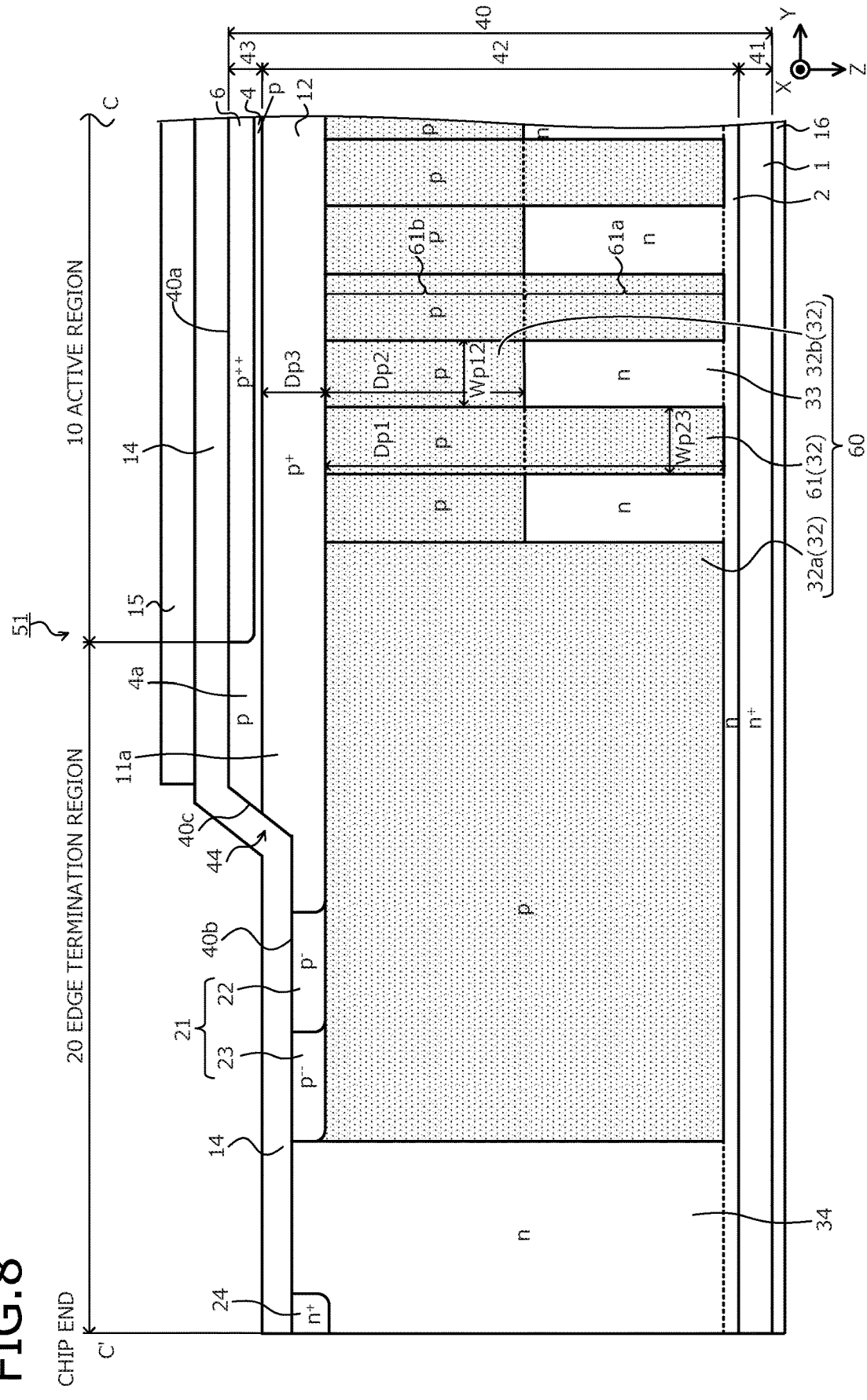
FIG. 8 is a cross-sectional view of the structure of the silicon carbide semiconductor device according to the second embodiment.

Next, a structure of a silicon carbide semiconductor device according to a second embodiment is described. FIGS. 7 and 8 are cross-sectional views of the structure of the silicon carbide semiconductor device according to the second embodiment. A layout of a silicon carbide semiconductor device 51 according to the second embodiment, as viewed from the front side of the semiconductor substrate (semiconductor chip) 40 thereof is similar to that of the first embodiment (refer to FIG. 1). FIGS. 7 and 8 are cross-sectional views of the structure along cutting line A1-A1' and cutting line C-C' in FIG. 1, respectively. FIG. 7 is a cross-sectional view when narrow-width p-type column regions 61 are viewed from the second direction Y. FIG. 8 is a cross-sectional view when the p-type column regions 32 are viewed from the first direction X.

In the silicon carbide semiconductor device 51 according to the second embodiment, a cross-section when the short p-type column regions 32b are viewed from the second direction Y is similar to that of the first embodiment (refer to FIG. 3), a cross-section when the n-type column regions 31 are viewed from the first direction X is similar to that of the first embodiment (refer to FIG. 4), and the configuration of the edge termination region 20 is similar to that of the first embodiment. The silicon carbide semiconductor device 51 according to the second embodiment differs from the silicon carbide semiconductor device 50 according to the first embodiment (FIGS. 1 to 5) in that in the active region 10, the p-type column regions 32 of a parallel pn layer 60 includes ones (hereinafter, narrow-width p-type column regions) 61 that extend linearly in the second direction Y and have a width Wp22 (in the lateral direction) that is relatively narrow.

In particular, in the second embodiment, the parallel pn layer 60 is configured by the n-type column regions 31, 33, 62 and the p-type column regions 32 (the narrow-width p-type column regions 61 and the short p-type column regions 32b of the active region 10, the long p-type column regions 32a of the edge termination region 20). Similarly to the parallel pn layer 3 of the first embodiment, the parallel pn layer 60 is a SJ structure in which the n-type column regions 31 and the p-type column regions 32 are adjacently disposed so as to repeatedly alternate with one another in the first direction X, which is parallel to the front surface of the semiconductor substrate 40. Configuration of the n-type column regions 31, 33 and the long p-type column regions 32a of the edge termination region 20 is similar to that of the first embodiment.

In the active region 10, the p-type column regions 32 are formed by the narrow-width p-type column regions 61 and the short p-type column regions 32b that are adjacently disposed so as to repeatedly alternate with one another in the second direction Y. Each of the narrow-width p-type column regions 61 has a portion 61b that faces the front surface of the semiconductor substrate 40 and has a width Wp21 that is substantially equal to the width Wp1-2 of the short p-type column regions 32b in the lateral direction, each of the narrow-width p-type column regions 61 further has a portion 61a that faces the back surface of the semiconductor substrate 40 and has a width Wp22 that is narrower than the width Wp1-2 of the short p-type column regions 32b in the lateral direction. The narrow-width p-type column regions 61 have a width Wp23 (in the longitudinal direction) that is substantially equal to that of the portion 61b that is relatively closer to the front surface of the semiconductor substrate 40 and that of the portion 61a that is relatively closer to the back surface of the semiconductor substrate 40. Excluding the widths Wp21, Wp22 of the narrow-width p-type column regions 61 in the lateral direction, configuration thereof is similar to that of the long p-type column regions 32a in the first embodiment (refer to FIGS. 2 and 3).

Configuration of the short p-type column regions 32b is similar to that of the short p-type column regions 32b in the first embodiment. Between the narrow-width p-type column regions 61 and the n-type column regions 31, n-type column regions 62 are provided in contact with these regions and the n-type buffer region 2 (in an instance in which the n-type buffer region 2 is omitted, the n+-type drain region 1). In the narrow-width p-type column regions 61, the width Wp22 (in the lateral direction) of the portions 61a that are relatively closer to the back surface of the semiconductor substrate 40 is relatively narrow, whereby in the active region 10, the parallel pn layer 60 may be configured so that the relatively p-rich state of an upper portion thereof that is relatively closer to the front surface of the semiconductor substrate 40 is further enhanced and the relatively n-rich state of a lower portion thereof that is relatively closer to the back surface of the semiconductor substrate 40 is further enhanced.

In the narrow-width p-type column regions 61, the portions 61a thereof that are relatively closer to the back surface of the semiconductor substrate 40 and have the relatively narrow width Wp22 in the lateral direction are disposed closer to the back surface of the semiconductor substrate 40 than is the interface between the short p-type column regions 32b and the n-type column regions 33. Therefore, similarly to the first embodiment, in the active region 10, in a portion of the parallel pn layer 60, from the interface between the short p-type column regions 32b and the n-type column regions 33 to a side of the parallel pn layer 60 facing the front surface of the semiconductor substrate 40, equilibrium between the charge of the n-type column regions 31 and the charge of the p-type column regions 32 is roughly maintained while a portion of the parallel pn layer 60 closer to the back surface of the semiconductor substrate 40 than is the interface between the short p-type column regions 32b and the n-type column regions 33 is relatively n-rich.

A method of manufacturing the silicon carbide semiconductor device 51 according to the second embodiment may be implemented by suitably changing the pattern of openings of the ion implantation mask for forming the p-type column regions 32, in the method of manufacturing the silicon carbide semiconductor device 50 according to the first embodiment.

As described, according to the second embodiment, the p-type column regions include ones (narrow-width p-type column regions) having a width that is relatively narrow (narrow width (in the lateral direction) of a portion of each narrow-width p-type column region), whereby the parallel pn layer may be configured so that the relatively p-rich state of the upper portion thereof that is relatively closer to the front surface of the semiconductor substrate is further enhanced and the relatively n-rich state of the lower portion thereof that is relatively closer to the back surface of the semiconductor substrate is further enhanced. As a result, in the active region, the charge balance of the n-type column regions and the p-type column regions may be adjusted and effects similar to those of the first embodiment may be obtained.

Figure 9:
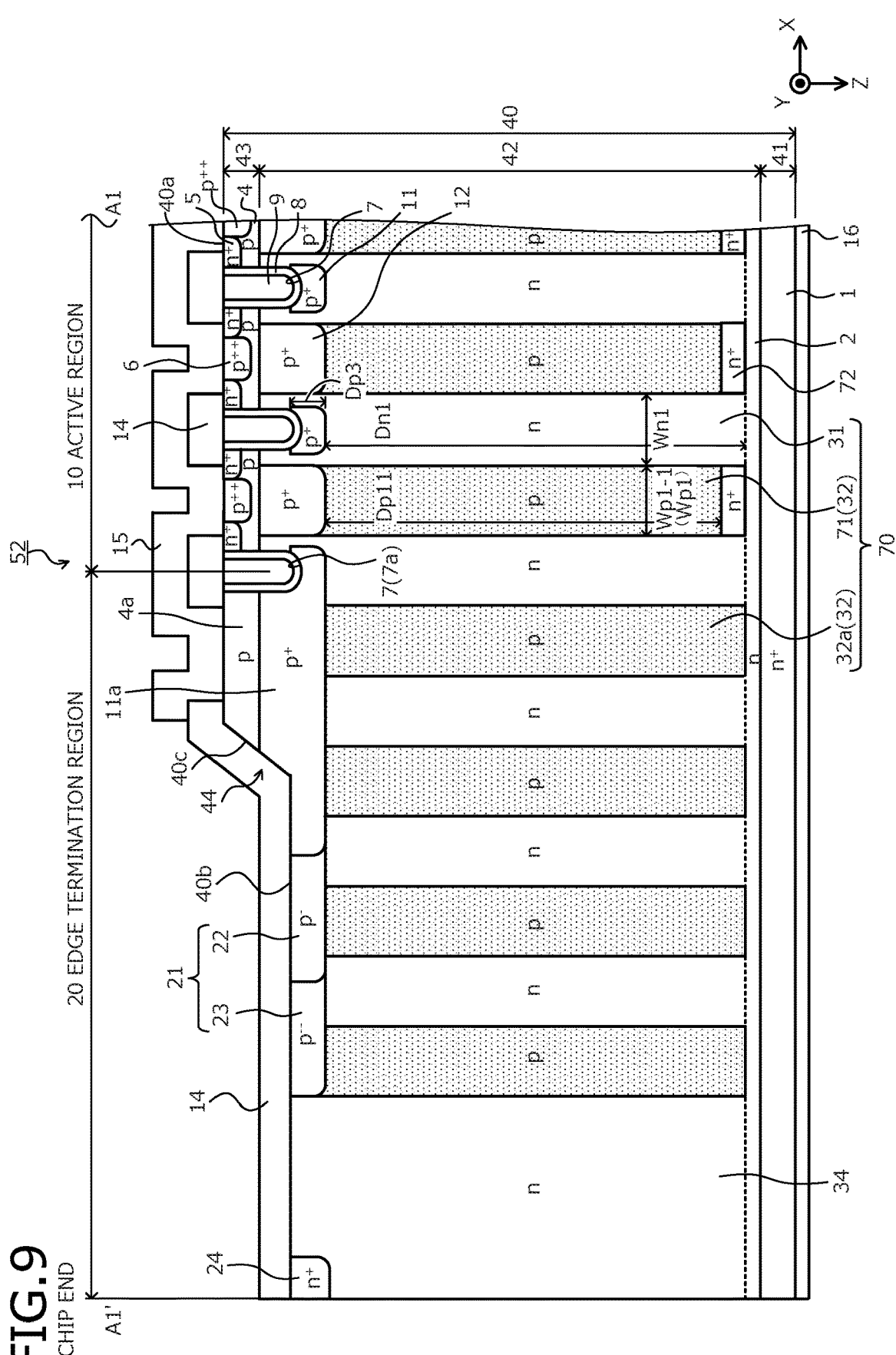
FIG. 9 is a cross-sectional view of a structure of a silicon carbide semiconductor device according to a third embodiment.
Figure 10:
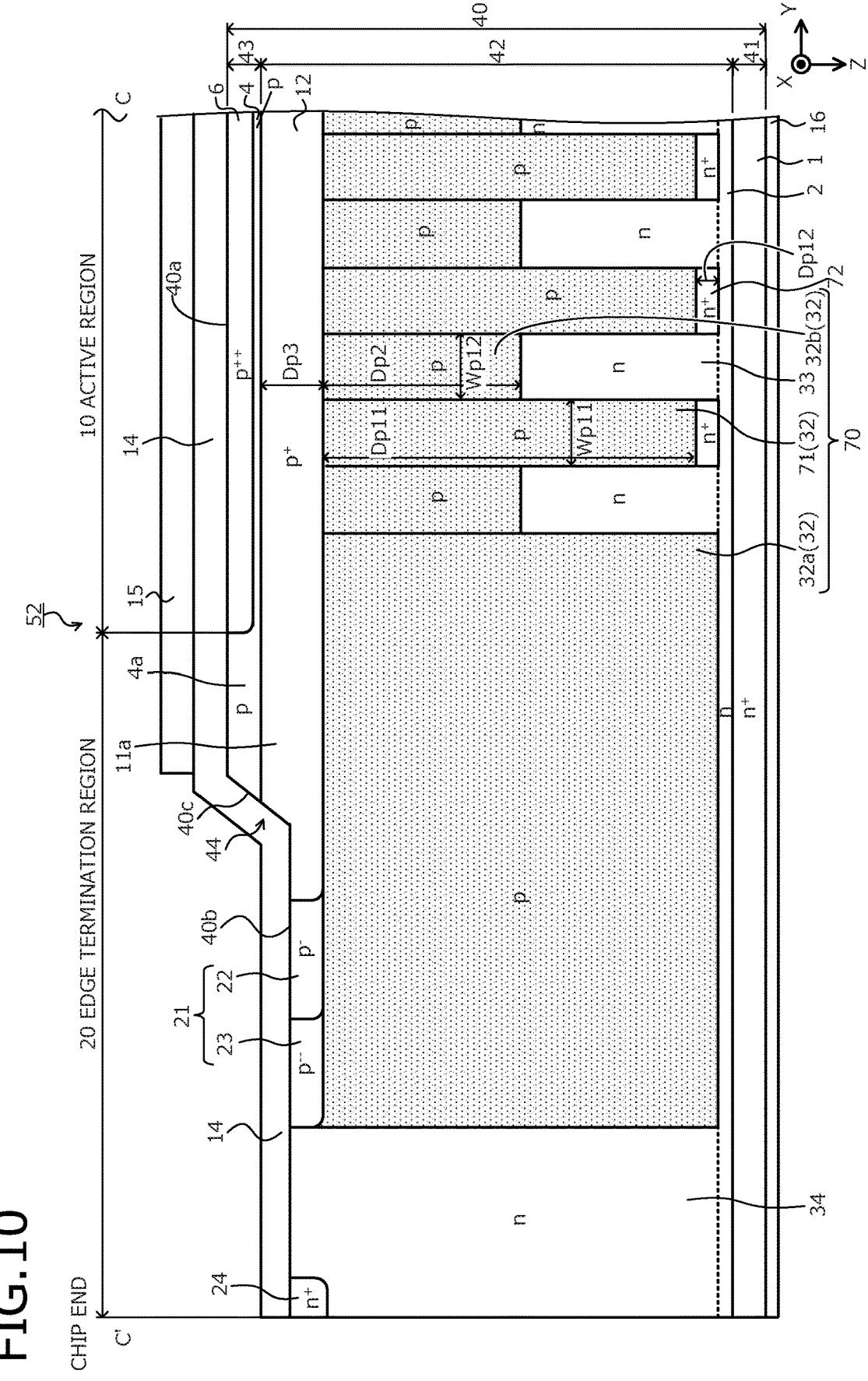
FIG. 10 is a cross-sectional view of the structure of the silicon carbide semiconductor device according to the third embodiment.

Next, a structure of a silicon carbide semiconductor device according to a third embodiment is described. FIGS. 9 and 10 are cross-sectional views of the structure of the silicon carbide semiconductor device according to the third embodiment. A layout of a silicon carbide semiconductor device 52 according to the third embodiment, as viewed from the front side of the semiconductor substrate (semiconductor chip) 40 is similar to that of the first embodiment (refer to FIG. 1). FIGS. 9 and 10 are cross-sectional views of the structure along cutting line A1-A1' and cutting line C-C' in FIG. 1, respectively. FIG. 9 is a cross-sectional view when the long p-type column regions 32a, 71 are viewed from the second direction Y. FIG. 10 is a cross-sectional view when the p-type column regions 32 are viewed from the first direction X.

In the silicon carbide semiconductor device 52 according to the third embodiment, a cross-section when the short p-type column regions 32b are viewed from the second direction Y is similar to that of the first embodiment (refer to FIG. 3), a cross-section when the n-type column regions 31 are viewed from the first direction X is similar to that of the first embodiment (refer to FIG. 4), and the configuration of the edge termination region 20 is similar to that of the first embodiment. The silicon carbide semiconductor device 52 according to the third embodiment differs from the silicon carbide semiconductor device 50 according to the first embodiment (refer to FIGS. 1 to 5) in that, in the active region 10, directly beneath the p-type column regions 32 of a parallel pn layer 70, n+-type regions (first-conductivity-type high-concentration regions) 72 are disposed in contact with the p-type column regions 32.

In the third embodiment, the parallel pn layer 70 is configured by the n-type column regions 31, 33 and the p-type column regions 32 (long p-type column regions 71 and the short p-type column regions 32b of the active region 10, and the long p-type column regions 32a of the edge termination region 20). The parallel pn layer 70, similarly to the parallel pn layer 3 of the first embodiment, is a SJ structure in which the n-type column regions 31 and the p-type column regions 32 are adjacently disposed so as to repeatedly alternate with one another in the first direction X, which is parallel to the front surface of the semiconductor substrate 40. Configuration of the n-type column regions 31, 33, the short p-type column regions 32b of the active region 10, and the long p-type column regions 32a of the edge termination region 20 is similar to that of the first embodiment.

In the active region 10, the n+-type regions 72 are scattered in the second direction Y so as to be provided between and in contact with the long p-type column regions 71 and the n-type buffer region 2 (in an instance in which the n-type buffer region 2 is omitted, the n+-type drain region 1). A width in the lateral direction and a width in the longitudinal direction of the n+-type regions 72 are substantially equal to the width Wp1-1 in the lateral direction and the width Wp11 in the longitudinal direction of the long p-type column regions 71, respectively; and the n+-type regions 72 are in contact with the n-type column regions 31, 33. Excluding the length Dp11 of the long p-type column regions 71 in the depth direction Z in the active region 10, configuration thereof is similar to that of the long p-type column regions 32a in the edge termination region 20.

In the active region 10, the length Dp11 of the long p-type column regions 71 in the depth direction Z is shorter than the length Dp1 of the long p-type column regions 32a in the depth direction Z in the edge termination region 20 by a length Dp12 of the n$^+$-type regions 72 in the depth direction Z. The length Dp11 of the long p-type column regions 71 in the depth direction Z is a length from an interface between the long p-type column regions 71 and the p$^+$-type regions 12 to an interface between the long p-type column regions 71 and the n$^+$-type regions 72. The length Dp12 of the n$^+$-type regions 72 in the depth direction Z is a length from an interface between the n$^+$-type regions 72 and the long p-type column regions 71 to an interface between the n$^+$-type regions 72 and the n-type buffer region 2 (in an instance in which the n-type buffer region 2 is omitted, the n$^+$-type drain region 1).

A method of manufacturing the silicon carbide semiconductor device 52 according to the third embodiment may be implemented by selectively forming the n$^+$-type regions 72 in the n-type epitaxial layer 42 by ion implantation before the long p-type column regions 71 are formed in the n-type epitaxial layer 42 by the multistage epitaxial method, in the method of manufacturing the silicon carbide semiconductor device 50 according to the first embodiment. Alternatively, when the trench filling epitaxial method is used to form the parallel pn layer 70 in the n-type epitaxial layer 42, before the p-type epitaxial layer constituting the long p-type column regions 71 is embedded in the SJ trenches, the n$^+$-type regions 72 are formed by ion implantation at the bottoms of the SJ trenches.

Figure 11:
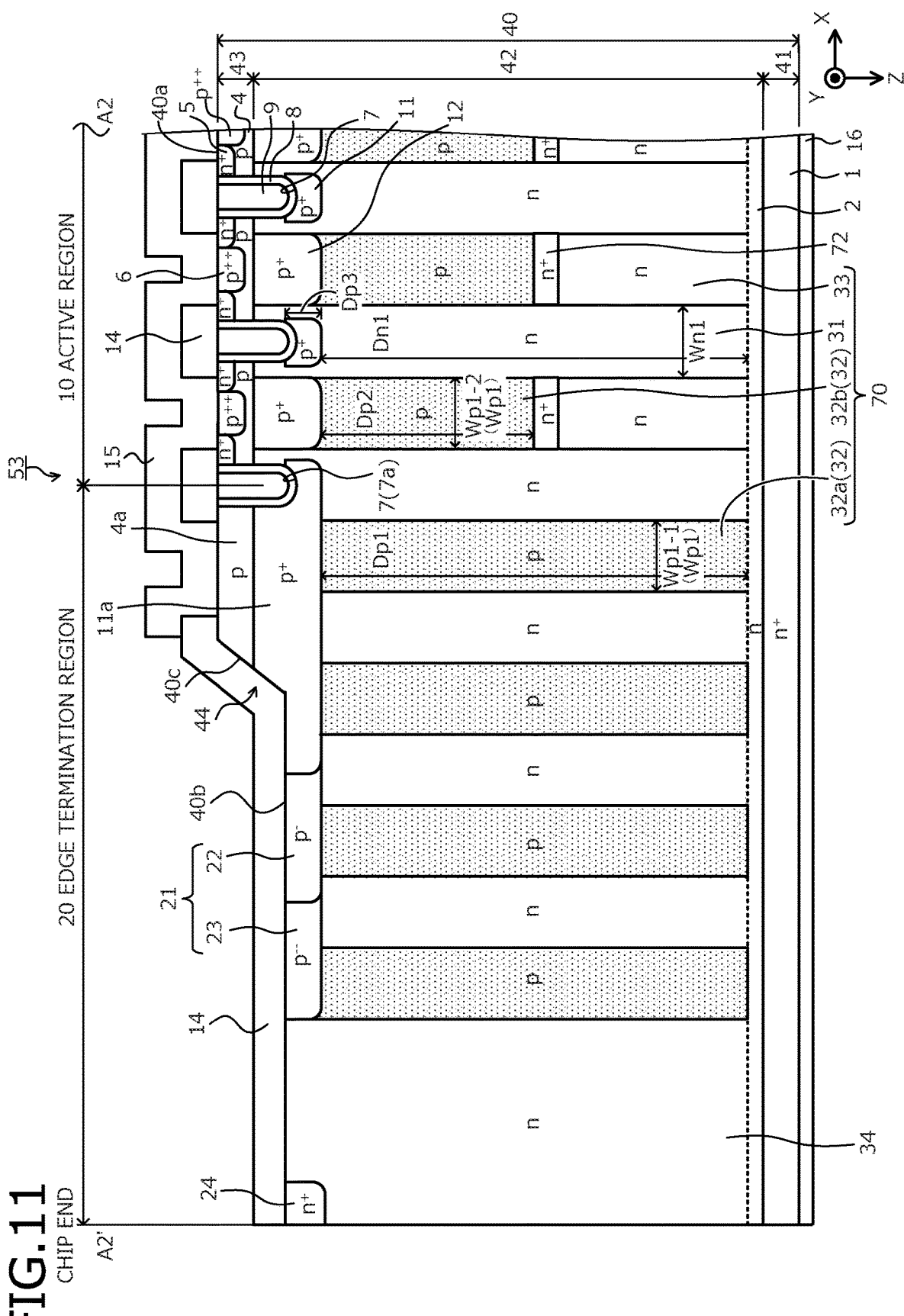
FIG. 11 is a cross-sectional view of another example of the silicon carbide semiconductor device according to the third embodiment.
Figure 12A:
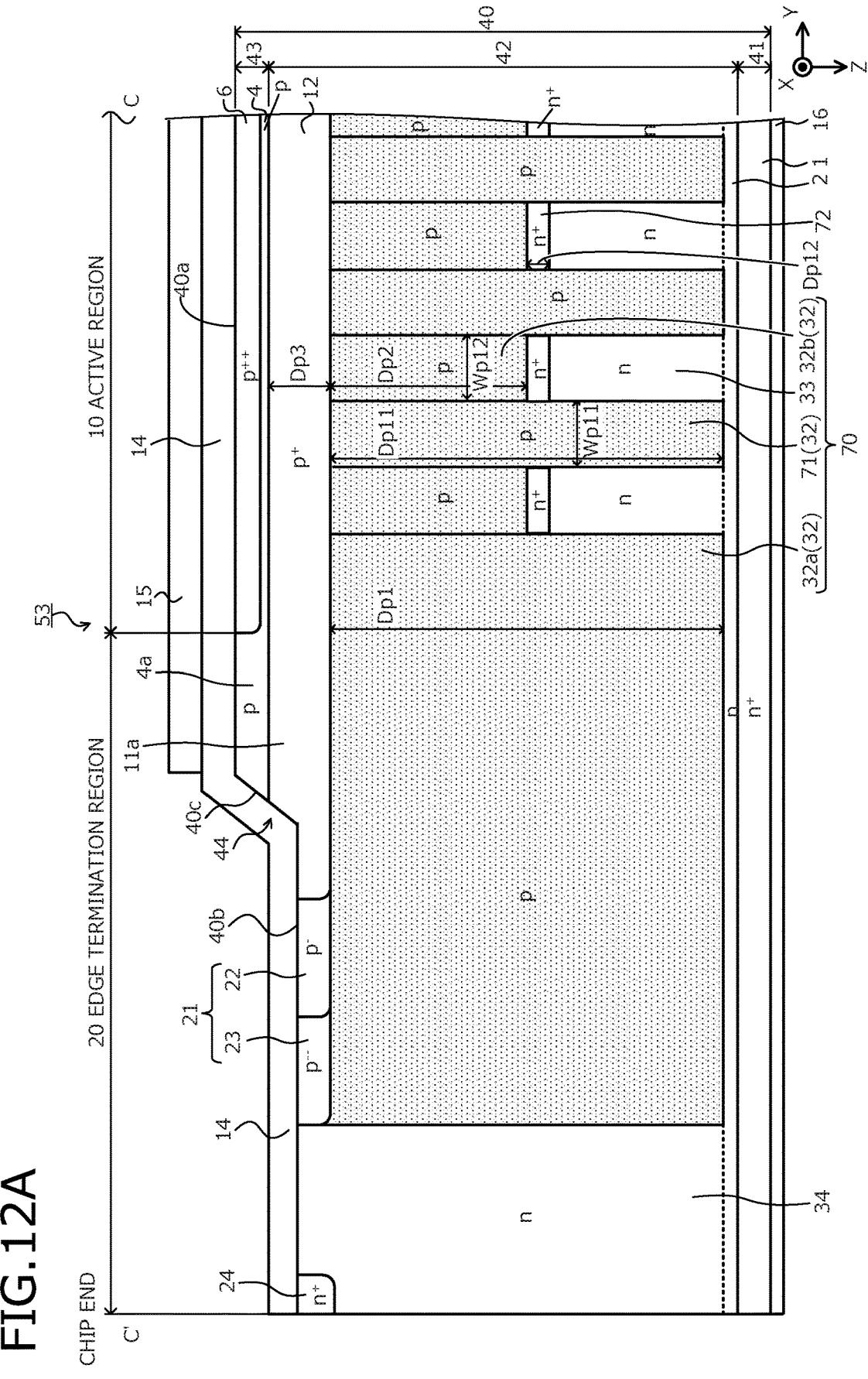
FIG. 12A is a cross-sectional view of another example of the silicon carbide semiconductor device according to the third embodiment.
Figure 12B:
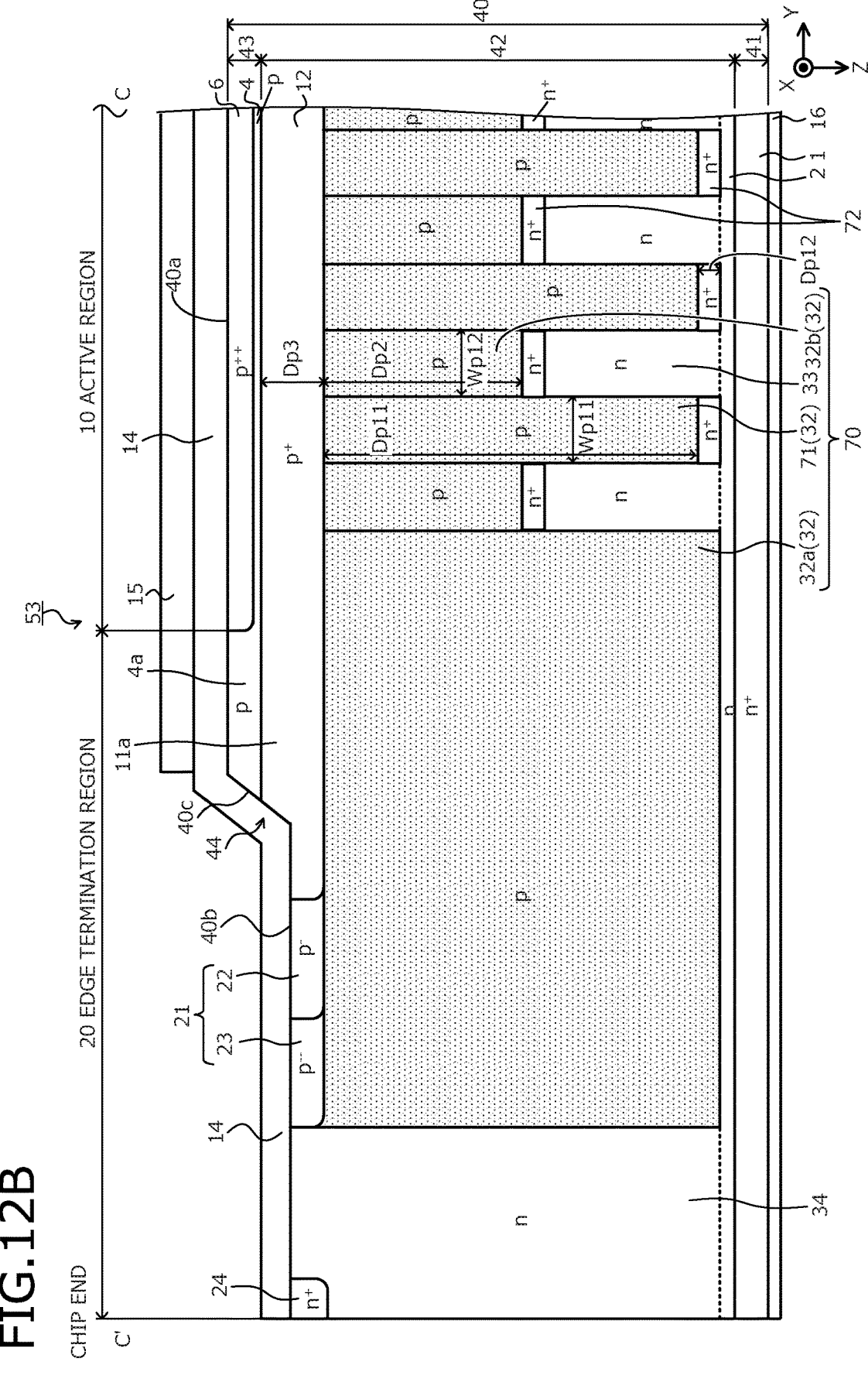
FIG. 12B is a cross-sectional view of another example of the silicon carbide semiconductor device according to the third embodiment.

FIGS. 11, 12A, and 12B are cross-sectional views of other examples of the silicon carbide semiconductor device according to the third embodiment. FIG. 11 is a cross-sectional view of a structure along cutting line A2-A2' in FIG. 1. FIGS. 12A and 12B depict another example of the structure along cutting line C-C' in FIG. 1. A silicon carbide semiconductor device 53 according to the third embodiment depicted in FIGS. 11, 12A, and 12B differs from the silicon carbide semiconductor device 52 according to the third embodiment depicted in FIGS. 9 and 10 in that the n$^+$-type regions 72 are disposed scattered between the short p-type column regions 32b and the n-type column regions 33. The n$^+$-type regions 72 directly beneath the short p-type column regions 32b are disposed scattered in the second direction Y so as to be disposed between and in contact with the short p-type column regions 32b and the n-type column regions 33.

The n$^+$-type regions 72 directly beneath the short p-type column regions 32b are in contact with the long p-type column regions 71 and have a width in the lateral direction and a width in the longitudinal direction that are substantially equal to the width Wp1-2 of the short p-type column regions 32b in the lateral direction and the width Wp12 thereof in longitudinal direction. The n$^+$-type regions 72 may be disposed only directly beneath the short p-type column regions 32b (refer to FIGS. 11 and 12A), or may be disposed directly beneath both the long p-type column regions 71 and the short p-type column regions 32b (refer to FIGS. 9, 11, and 12B). In an instance in which the n$^+$-type regions 72 are omitted directly beneath the long p-type column regions 71 (FIG. 12A), the length Dp11 of the long p-type column regions 71 in the depth direction Z in the active region 10 are substantially equal to the length Dp1 of the long p-type column regions 32a in the depth direction Z in the edge termination region 20.

Further, while not depicted, in the silicon carbide semiconductor devices 52, 53 according to the third embodiment (refer to FIGS. 9 to 11, 12A, and 12B), the n$^+$-type regions 72 directly beneath the long p-type column regions 71 may protrude toward the back surface of the semiconductor substrate 40 and terminate in the n-type buffer region 2 (in an instance in which the n-type buffer region 2 is omitted, the n$^+$-type drain region 1). Further, the narrow-width p-type column regions 61 (refer to FIGS. 7 and 8) of the second embodiment may be applied to the silicon carbide semiconductor devices 52, 53 according to the third embodiment, whereby the long p-type column regions 71 may be provided as narrow-width p-type column regions in which a lower portion thereof relatively closer to the back surface of the semiconductor substrate 40 than is an upper portion thereof that is relatively closer to the front surface of the semiconductor substrate 40 has a width in the lateral direction that is relatively narrower than that of the upper portion.

As described, according to the third embodiment, the n$^+$-type regions are disposed directly beneath the p-type column regions, whereby the parallel pn layer may be configured so that the relatively p-rich state of the upper portion thereof that is relatively closer to the front surface of the semiconductor substrate is further enhanced and the relatively n-rich state of the lower portion thereof that is relatively closer to the back surface of the semiconductor substrate is further enhanced. As a result, in the active region, the charge balance of the n-type column regions and the p-type column regions may be adjusted and effects similar to those of the first and second embodiments may be obtained.

Figure 13:
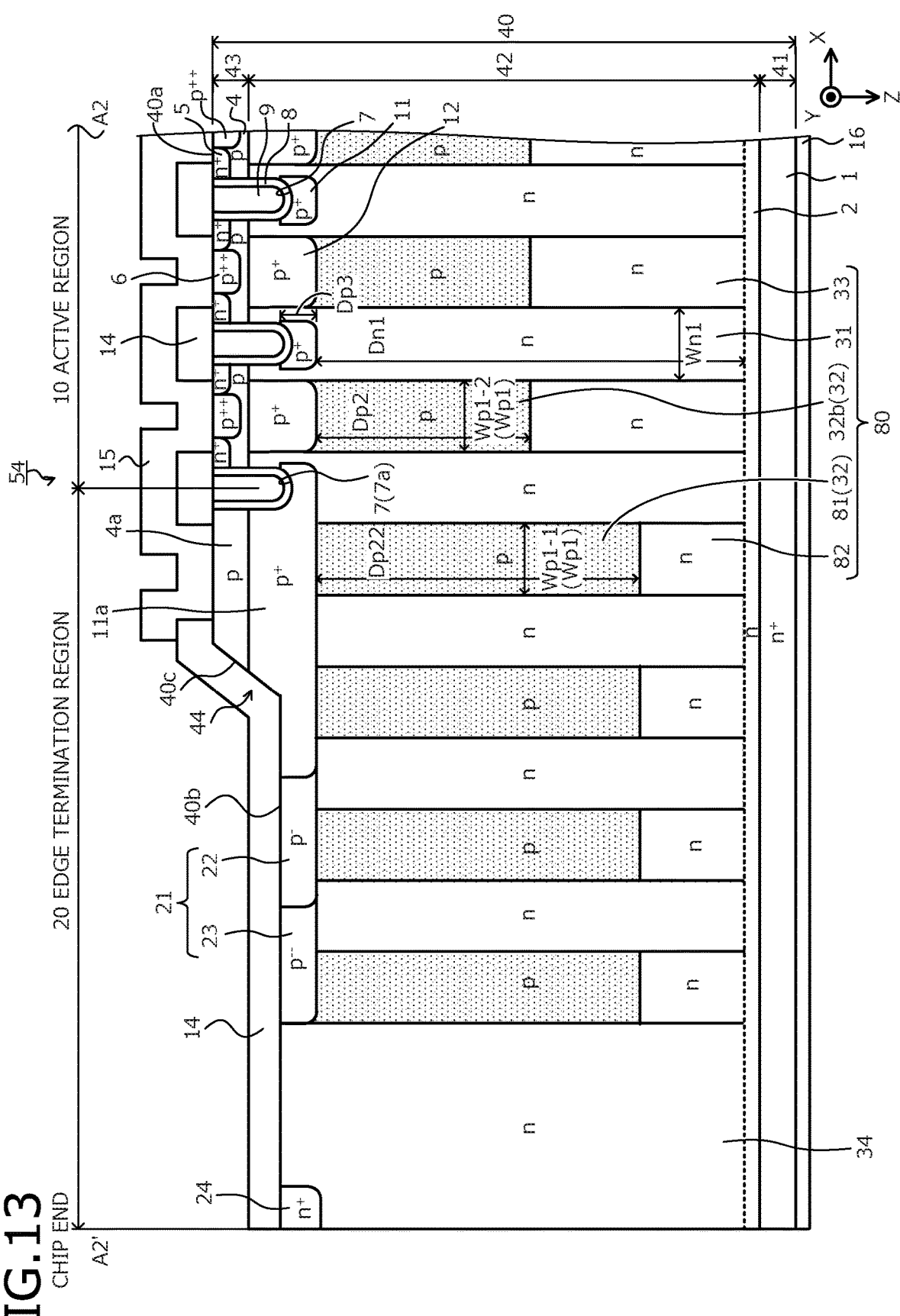
FIG. 13 is a cross-sectional view of a structure of a silicon carbide semiconductor device according to a fourth embodiment.
Figure 14:
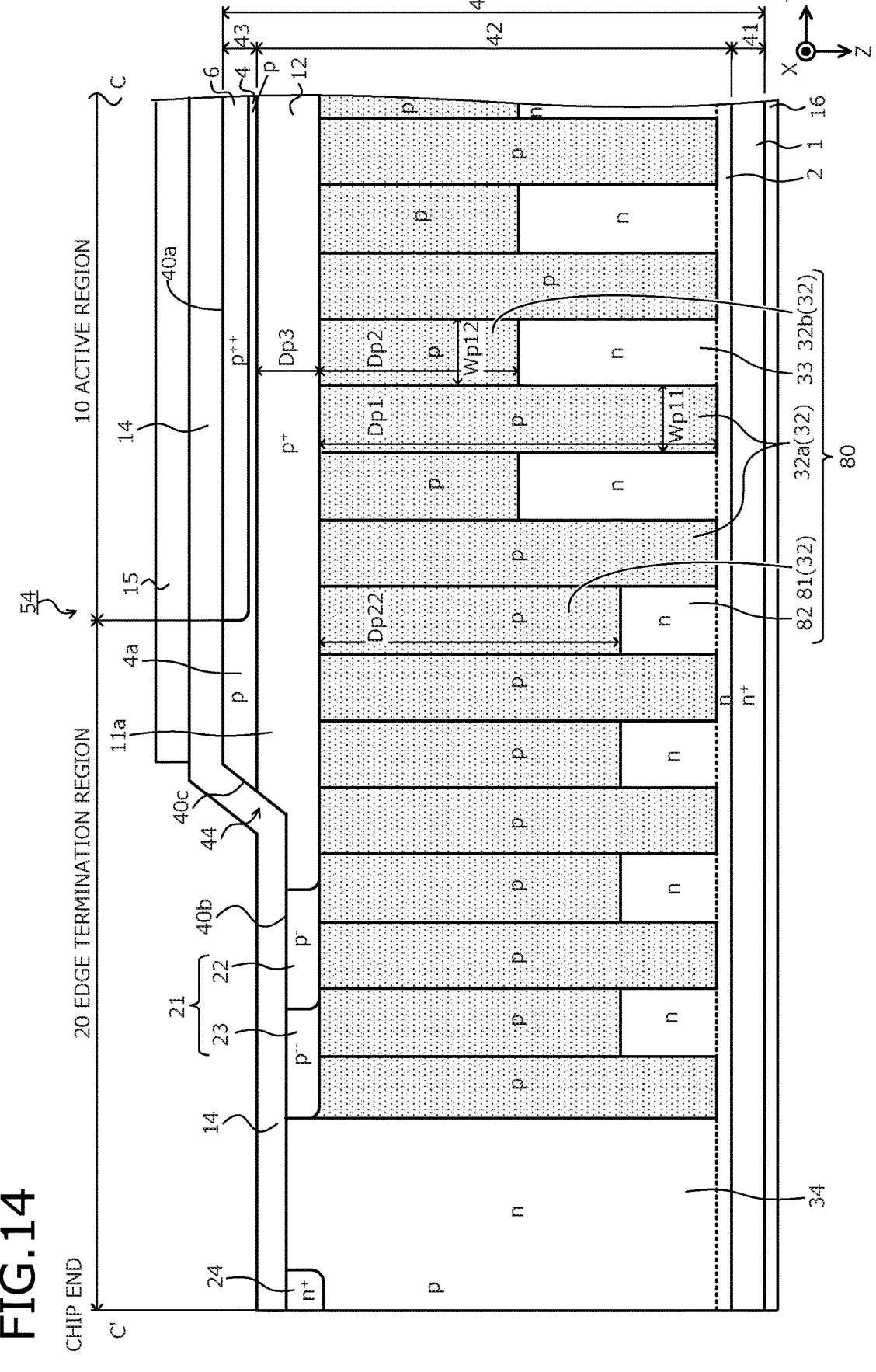
FIG. 14 is a cross-sectional view of the structure of the silicon carbide semiconductor device according to the fourth embodiment.
Figure 15:
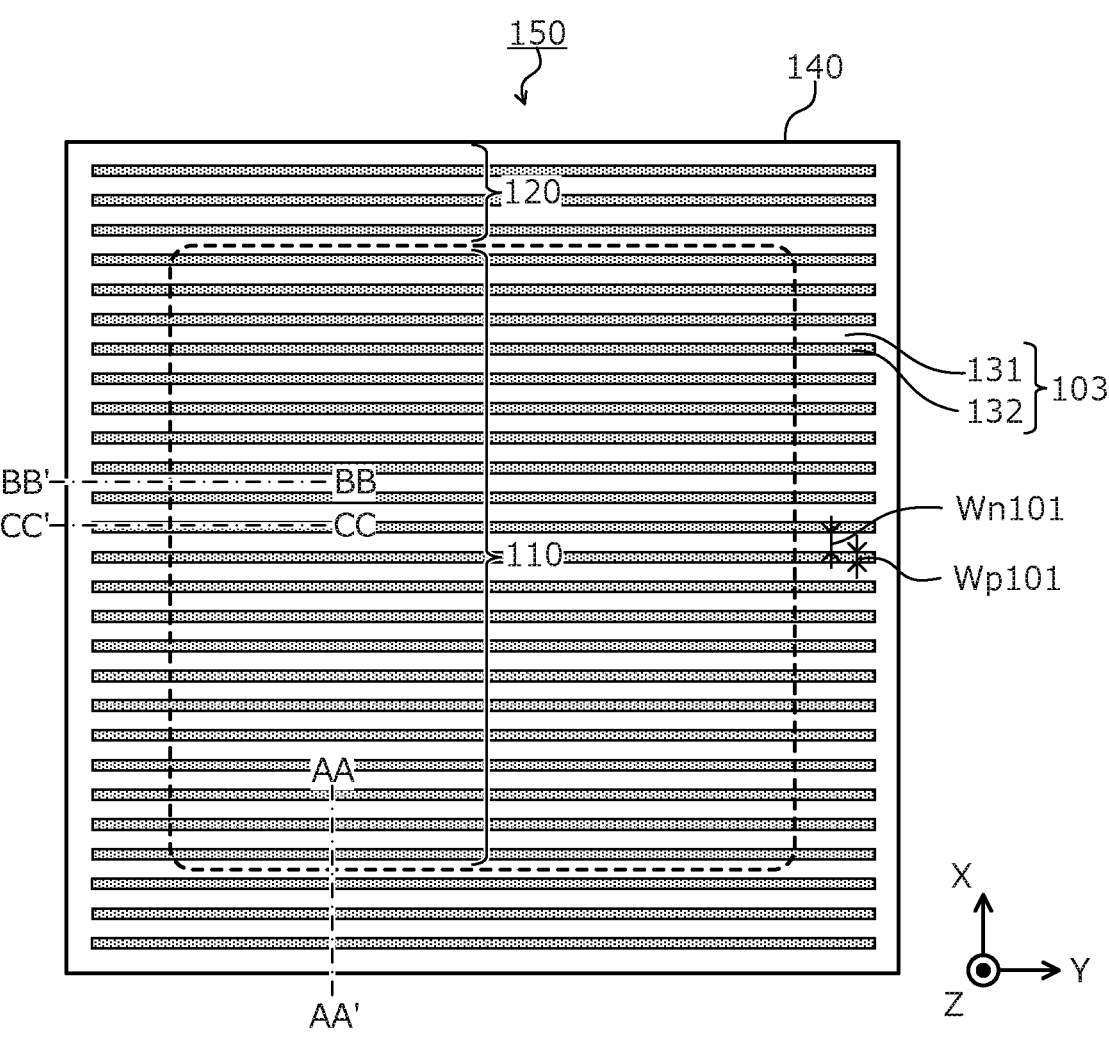
FIG. 15 is a plan view depicting a layout when a conventional silicon carbide semiconductor device is viewed from a front side of a semiconductor substrate thereof.
Figure 16:
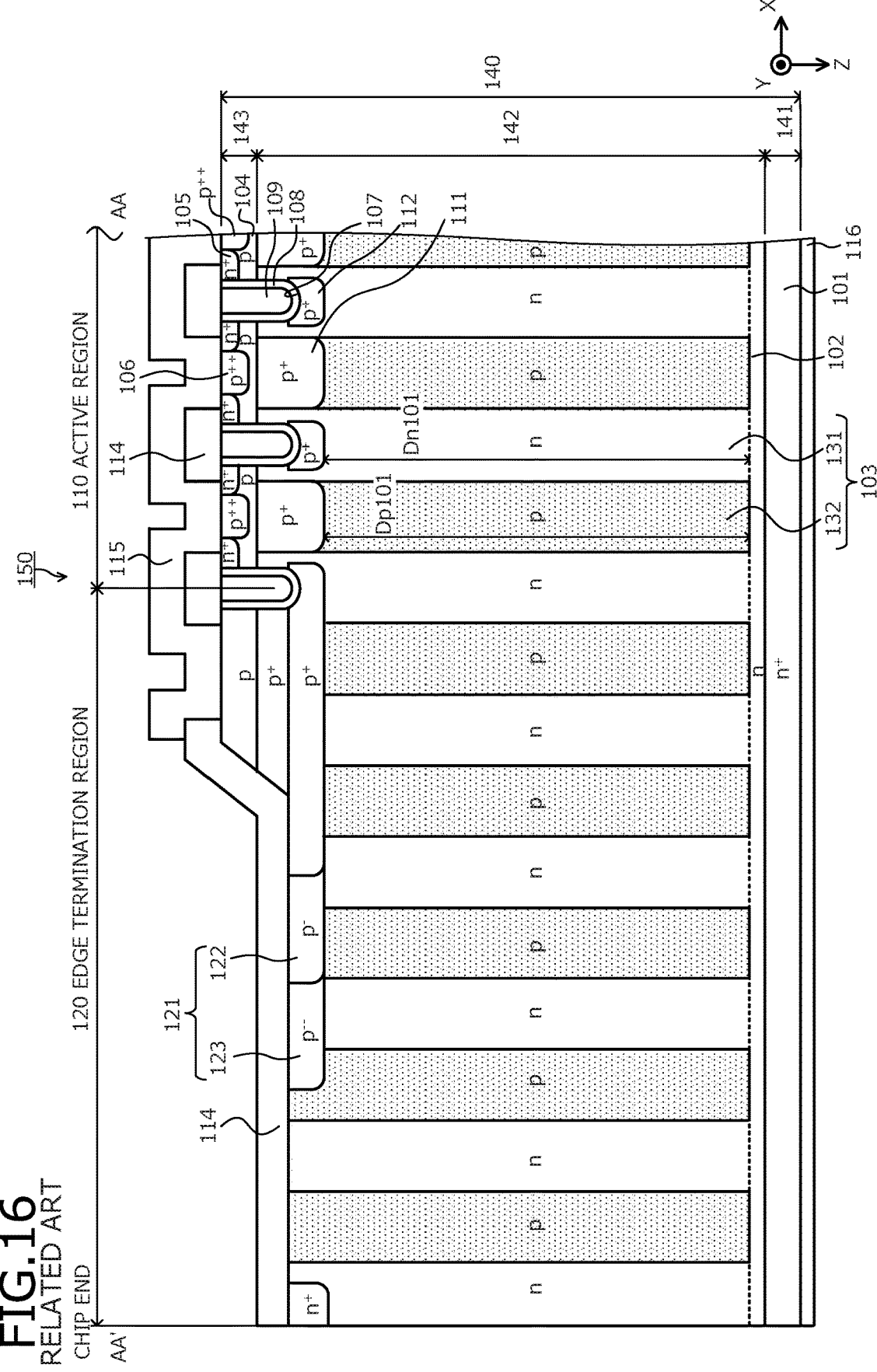
FIG. 16 is a cross-sectional view of the structure along cutting line AA-AA in FIG. 15.
Figure 17:
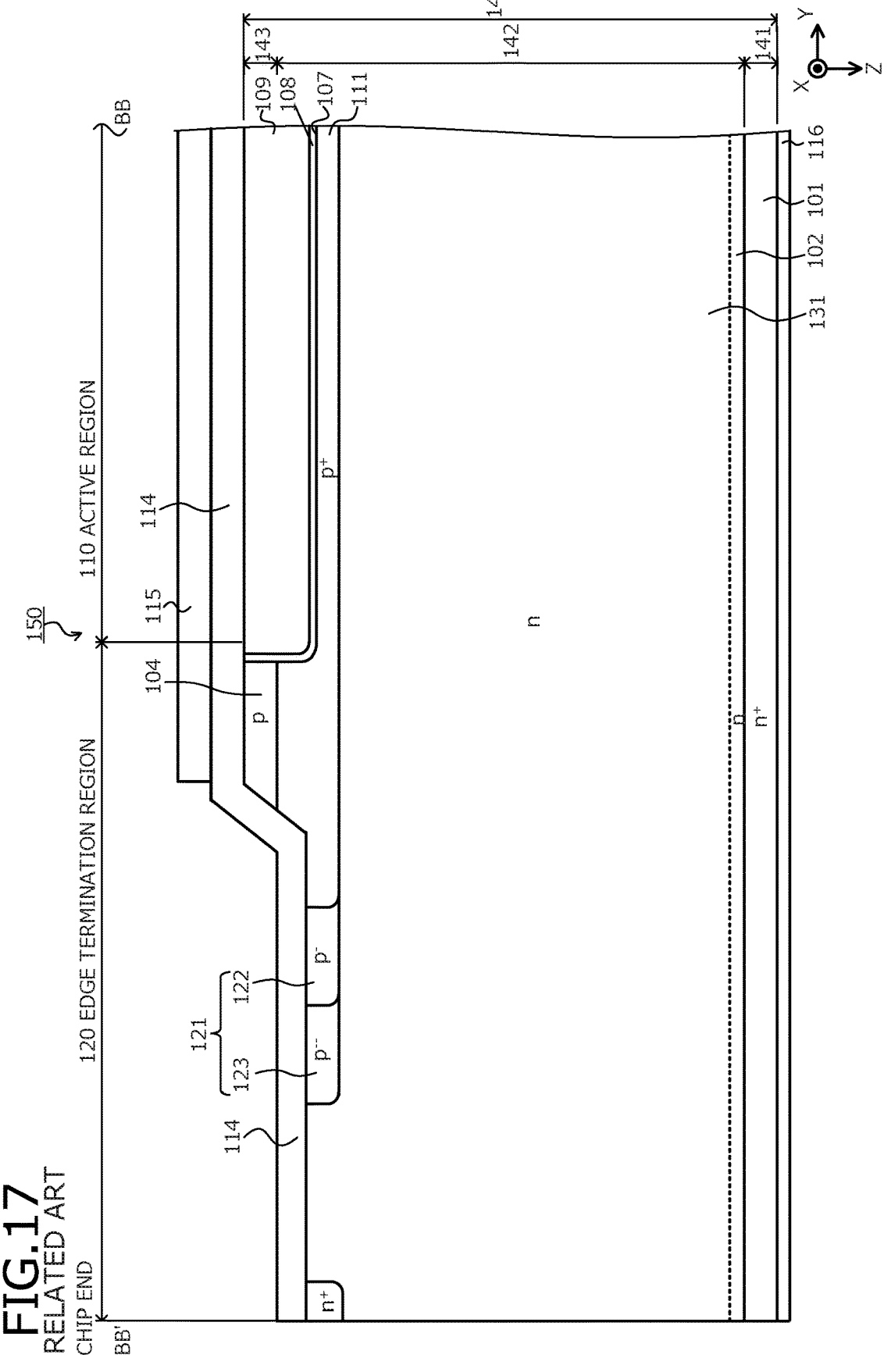
FIG. 17 is a cross-sectional view of the structure along cutting line BB-BB' in FIG. 15.
Figure 18:
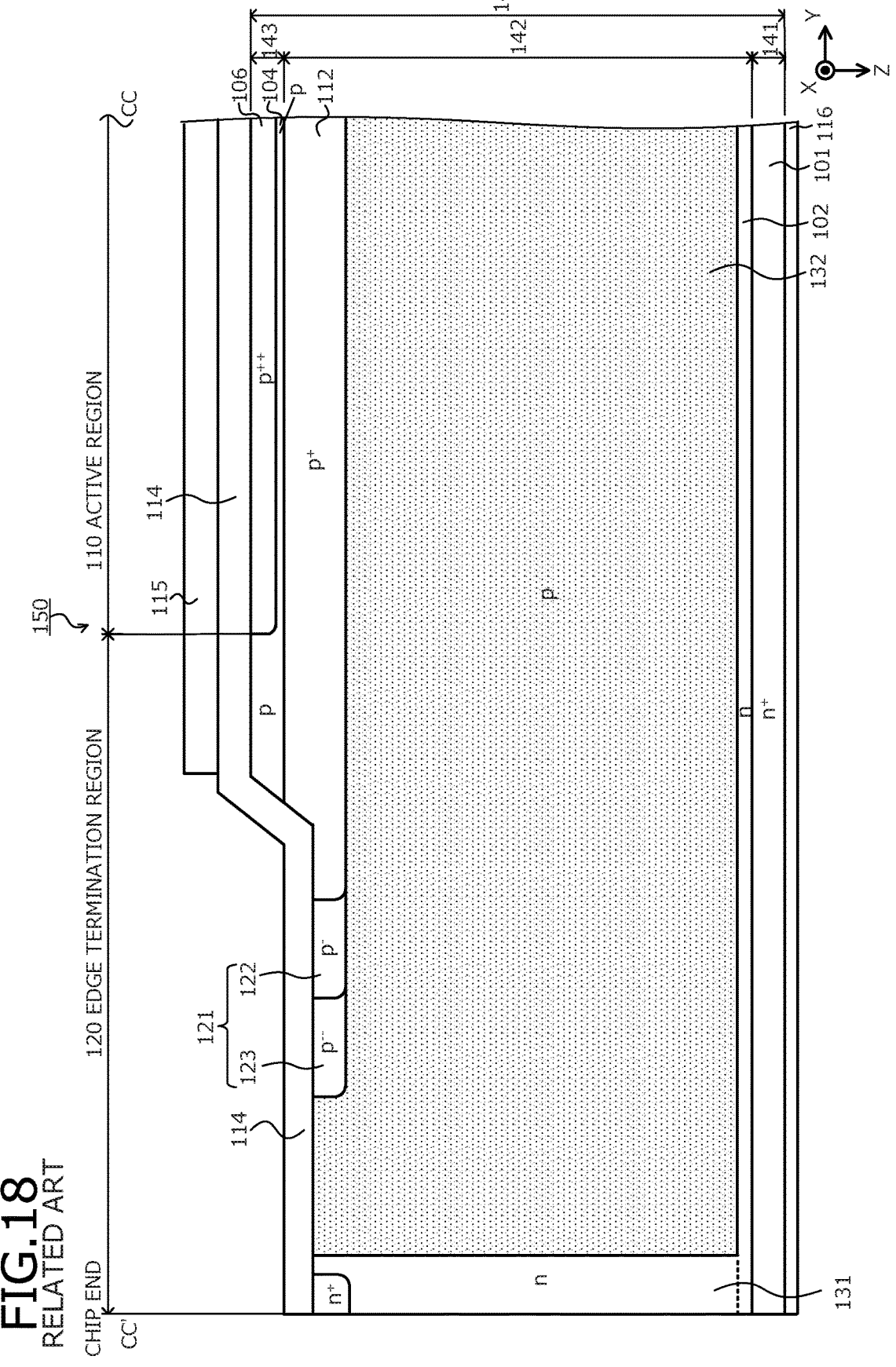
FIG. 18 is a cross-sectional view of the structure along cutting line CC-CC' in FIG. 15.

Next, a structure of a silicon carbide semiconductor device according to a fourth embodiment is described. FIGS. 13 and 14 are cross-sectional views of the structure of the silicon carbide semiconductor device according to the fourth embodiment. A layout of a silicon carbide semiconductor device 54 according to the fourth embodiment, as viewed from the semiconductor substrate (semiconductor chip) 40 thereof is similar to that of the first embodiment (refer to FIG. 1). FIGS. 13 and 14 are cross-sectional views of the structure along cutting line A2-A2' and cutting line C-C' in FIG. 1, respectively. FIG. 13 is a cross-sectional view when the short p-type column regions 32b, 81 are viewed from the second direction Y. FIG. 14 is a cross-sectional view when the p-type column regions 32 are viewed from the first direction X.

In the silicon carbide semiconductor device 54 according to the fourth embodiment, a cross-section when the long p-type column regions 32a are viewed from the second direction Y is similar to that of the first embodiment (refer to FIG. 2), a cross-section when the n-type column regions 31 are viewed from the first direction X is similar to that of the first embodiment (refer to FIG. 4), and the configuration of the active region 10 is similar to that of the first embodiment. The silicon carbide semiconductor device 54 according to the fourth embodiment differs from the silicon carbide semiconductor device 50 according to the first embodiment (refer to FIGS. 1 to 5) in that, in the edge termination region 20, the p-type column regions 32 of a parallel pn layer 80 include ones (later described short p-type column regions 81) that extend linearly in the second direction Y and the length Dp22 of which in the depth direction Z is shorter than that of others (the long p-type column regions 32a).

In the fourth embodiment, the parallel pn layer 80 is configured by the n-type column regions 31, 33, 82, and the p-type column regions 32 (the long p-type column regions 32a and the short p-type column regions 32b of the active region 10, and the long p-type column regions 32*a* and the short p-type column regions 81 of the edge termination region 20). Similarly to the parallel pn layer 3 of the first embodiment, the parallel pn layer 80 is a SJ structure in which the n-type column regions 31 and the p-type column regions 32 are adjacently disposed so as to repeatedly alternate with one another in the first direction X, which is parallel to the front surface of the semiconductor substrate 40. The n-type column regions 31, 33, and the long p-type column regions 32*a* and the short p-type column regions 32*b* of the active region 10 are similar to those of the first embodiment.

In the edge termination region 20, the p-type column regions 32 include the long p-type column regions 32*a* and the short p-type column regions 81, which are adjacently disposed so as to repeatedly alternate with one another in the second direction Y. The short p-type column regions 81 are apart from the n-type buffer region 2 (in an instance in which the n-type buffer region 2 is omitted, the n⁺-type drain region 1) in the depth direction Z. Between the short p-type column regions 81 and the n-type buffer region 2, n-type column regions 82 are provided in contact with these region, the long p-type column regions 32*a*, and the n-type column regions 31. The length Dp22 of the short p-type column regions 81 in the depth direction Z is longer than the length Dp2 of the short p-type column regions 32*b* in the depth direction Z, in the active region 10.

In the edge termination region 20, the length Dp22 of the short p-type column regions 81 in the depth direction Z is a length from an interface between the short p-type column regions 81 and the voltage withstanding structure 21 or the p⁺-type extension portion 11*a* to an interface between the short p-type column regions 81 and the n-type column regions 82. A width in the lateral direction and a width in the longitudinal direction of the short p-type column regions 81 are, respectively, equal to the width Wp1-2 in the lateral direction and the width Wp12 in the longitudinal direction of the short p-type column regions 32*b* in the active region 10. Configuration of the long p-type column regions 32*a* in the edge termination region 20 is similar to the configuration of the long p-type column regions 32*a* in the active region 10. The upper ends of the long p-type column regions 32*a* and upper ends of the short p-type column regions 81 are positioned at substantially the same depth.

In the edge termination region 20, with respect to the parallel pn layer 80, due to the short p-type column regions 81 disposed only in an upper portion (portion relatively closer to the front surface of the semiconductor substrate 40) of the parallel pn layer 80, the upper portion is relatively p-rich while a lower portion of the parallel pn layer 80 (portion relatively closer to the back surface of the semiconductor substrate 40) is relatively n-rich due to the n-type column regions 82 that are disposed facing the short p-type column regions 81 in the depth direction Z. Charge balance between the p-type column regions 32 and the n-type column regions 31 in the edge termination region 20 is adjusted by changing the length Dp22 of the short p-type column regions 81 in the depth direction Z, or changing the width Wp11 of the long p-type column regions 32*a* in the longitudinal direction, or changing both.

In the edge termination region 20 in the fourth embodiment, "p-rich" is a state in which an amount of charge expressed by a product obtained by multiplying the carrier concentration and the width Wp1 in the lateral direction of the p-type column regions 32 (the long p-type column regions 32*a* and the short p-type column regions 81) is greater than an amount of charge expressed by a product obtained by multiplying the carrier concentration and the width Wn1 in the lateral direction of the n-type column regions 31, 82. "N-rich" is a state in which an amount of charge expressed by a product obtained by multiplying the carrier concentration and the width Wn1 in the lateral direction of the n-type column regions 31, 82 is greater than an amount of charge expressed by a product obtained by multiplying the carrier concentration and the width Wp1 in the lateral direction of the p-type column regions 32 (the long p-type column regions 32*a* and the short p-type column regions 81).

In the edge termination region 20, an upper portion (portion relatively closer to the front surface of the semiconductor substrate 40) of the parallel pn layer 80 is relative p-rich, whereby decreases in the breakdown voltage of the edge termination region 20 may be reduced as compared to an instance in which the p-type column regions 32 in the edge termination region 20 include only the long p-type column regions 32*a* and thus, the margin for the breakdown voltage of the edge termination region 20 may be increased. In the edge termination region 20, the length Dp22 of the short p-type column regions 81 in the depth direction Z are longer than the length Dp2 of the short p-type column regions 32*b* in the depth direction Z, in the active region 10, whereby the n-rich of the lower portion of the parallel pn layer 80 relatively closer to the back surface of the semiconductor substrate 40 is greater in the active region 10 than in the edge termination region 20.

Further, in the edge termination region 20, the length Dp22 of the short p-type column regions 81 in the depth direction Z is longer than the length Dp2 of the short p-type column regions 32*b* in the depth direction Z in the active region 10, whereby in the active region 10, the length in the depth direction Z of a portion of the parallel pn layer 80 where equilibrium between the charge of the n-type column regions 31 and the charge of the p-type column regions 32 is roughly maintained is longer than that in the edge termination region 20. Therefore, in the edge termination region 20, even when the short p-type column regions 81 are provided as the p-type column regions 32, similarly to the first embodiment, the breakdown voltage of the active region 10 may be lower than the breakdown voltage of the edge termination region 20.

A method of manufacturing the silicon carbide semiconductor device 54 according to the fourth embodiment may be implemented by suitably changing the pattern of openings in the ion implantation mask for forming the p-type column regions 32, in the method of manufacturing the silicon carbide semiconductor device 50 according to the first embodiment.

The fourth embodiment maybe applied to the silicon carbide semiconductor devices 51 to 53 according to the second and third embodiments (FIGS. 7 to 11, 12A, 12B), whereby in the edge termination region 20, the parallel pn layers 60, 70 may be configured by the long p-type column regions 32*a* and the short p-type column regions 81.

As described, according to the fourth embodiment, in addition to obtaining effects similar to those of the first embodiment, the margin for the breakdown voltage of the edge termination region may be increased.

In the foregoing, the present invention is not limited to the embodiments described and various modifications within a range not departing from the spirit of the invention are possible. For example, without limitation to a MOSFET, application is possible to the silicon carbide semiconductor devices of various configurations having a trench gate structure. Further, the present invention is similarly implemented when the conductivity type (n-type, p-type) are reversed.

According to the invention described above, the breakdown voltage of the active region may be lower than the breakdown voltage of the edge termination region, whereby avalanche breakdown may be induced in active region, which has a large area and occupies a majority of the area (surface area) of the semiconductor substrate.

The silicon carbide semiconductor device according to the present invention achieves an effect in that resistance to destruction may be enhanced.

As described, the silicon carbide semiconductor device according to the present invention is useful for power semiconductor devices used in power converting equipment, power source devices of various types of industrial machines, etc.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device, comprising:
a semiconductor substrate containing silicon carbide, the semiconductor substrate having an active region, and
    a termination region surrounding a periphery of the active region in a plan view of the silicon carbide semiconductor device,
the semiconductor substrate having a first main surface and a second main surface that are opposite to each other;
a parallel pn layer provided in the semiconductor substrate;
a device structure provided in the semiconductor substrate and between the first main surface and the parallel pn layer;
a first electrode provided at the first main surface of the semiconductor substrate and electrically connected to the device structure; and
a second electrode provided on the second main surface of the semiconductor substrate, wherein
the parallel pn layer includes a plurality of first-conductivity-type column regions and a plurality of second-conductivity-type column regions that are adjacently disposed and repeatedly alternate with one another in a first direction that is parallel to the first main surface of the semiconductor substrate,
the plurality of first-conductivity-type column regions and the plurality of second-conductivity-type column regions span the active region and the termination region, and each extend in a second direction that is parallel to the first main surface and orthogonal to the first direction,
each of the plurality of first-conductivity-type column regions is of a same first impurity concentration,
each of the plurality of second-conductivity-type column regions is of a second impurity concentration that is equal to the first impurity concentration,
the plurality of second-conductivity-type column regions includes a plurality of first-length column regions and a plurality of second-length column regions, each second-length column region
    extending linearly in the second direction, and having, in a depth direction of the silicon carbide semiconductor device, a length that is shorter than a length of each of the plurality of first-length column regions, and
the parallel pn layer has a first portion and a second portion, the first portion being closer to the first main surface of the semiconductor substrate than is the second portion, and being more p-rich than the second portion, the second portion being closer to the second main surface of the semiconductor substrate than is the first portion and being more n-rich than the first portion,
the plurality of first-conductivity-type column regions extends between the plurality of second-length column regions and the second main surface of the semiconductor substrate, the plurality of first-conductivity-type column regions being in contact with the plurality of second-length column regions, and
a volume of the plurality of second-conductivity-type column regions is 20% or more, but less than 90%, of a total volume of the plurality of first-conductivity-type column regions.

2. The silicon carbide semiconductor device according to claim 1, wherein
the second portion of the parallel pn layer is more n-rich in the active region than in the termination region.

3. The silicon carbide semiconductor device according to claim 1, wherein
the plurality of second-length column regions is provided in both the active region and the termination region, and
the plurality of second-length column regions are shorter in the depth direction in the active region than in the termination region.

4. The silicon carbide semiconductor device according to claim 3, wherein
the first portion and the second portion are in both the active region and the termination region.

5. The silicon carbide semiconductor device according to claim 1, wherein
the plurality of second-length column regions and the plurality of first-length column regions are disposed adjacently and repeatedly alternate with one another in the second direction.

6. The silicon carbide semiconductor device according to claim 1, wherein
the plurality of second-length column regions includes two or more types each having a different length in the depth direction, the two or more types and the plurality of first-length column regions being disposed regularly in the second direction in the active region.

7. The silicon carbide semiconductor device according to claim 1, wherein
each of the plurality of second-length column regions is disposed adjacent to another one of the plurality of second-length column regions, in the first direction.

8. The silicon carbide semiconductor device according to claim 1, wherein
each of the plurality of second-length column regions is disposed adjacent to one of the plurality of first-length column regions, in the first direction.

9. The silicon carbide semiconductor device according to claim 1, wherein
for each of the plurality of first-length column regions, a portion thereof at the second portion of the parallel pn layer faces the second main surface of the semiconductor substrate, and has a width, in a lateral direction of the silicon carbide semiconductor device, that is narrower than a width of another portion thereof at the first portion of the parallel pn layer.

10. The silicon carbide semiconductor device according to claim 1, further comprising a plurality of first-conductivity-type high-concentration regions provided at ends of the plurality of second-conductivity-type column regions, the ends facing the second main surface, an impurity concentration of the plurality of first-conductivity-type high-concentration regions being higher than the first impurity concentration.

11. The silicon carbide semiconductor device according to claim 1, wherein the length of each of the plurality of first-length column regions in the depth direction is equal to a length of each of the plurality of first-conductivity-type column regions in the depth direction.

12. The silicon carbide semiconductor device according to claim 1, wherein the device structure has:

a first semiconductor region of a second conductivity type, provided in the semiconductor substrate and between the first main surface and the parallel pn layer, a plurality of second semiconductor regions of a first conductivity type, selectively provided in the semiconductor substrate and between the first main surface and the first semiconductor region;

a plurality of trenches penetrating through the plurality of second semiconductor regions and the first semiconductor region and reaching the plurality of first-conductivity-type column regions;

a plurality of gate electrodes provided in the plurality of trenches, via a plurality of gate insulating films, respectively;

a plurality of first second-conductivity-type high-concentration regions provided between bottoms of the plurality of trenches and the plurality of first-conductivity-type column regions, apart from the first semiconductor region, the plurality of first second-conductivity-type high-concentration regions having an impurity concentration that is higher than an impurity concentration of the first semiconductor region; and a plurality of second second-conductivity-type high-concentration regions, provided between and in contact with the first semiconductor region and the plurality of second-conductivity-type column regions, the plurality of second second-conductivity-type high-concentration regions being apart from the plurality of trenches and the plurality of first second-conductivity-type high-concentration regions, and having an impurity concentration that is higher than the impurity concentration of the first semiconductor region, wherein the first electrode is electrically connected to the plurality of second semiconductor regions and the first semiconductor region, and the length of each of the plurality of second-length column regions in the depth direction is longer than a length of each of the plurality of first second-conductivity-type high-concentration regions in the depth direction.

* * * * *